United States Patent
Li et al.

(10) Patent No.: US 11,957,023 B2
(45) Date of Patent: Apr. 9, 2024

(54) LIGHT-EMITTING DIODE DISPLAY PANEL, MANUFACTURING METHOD THEREOF, AND DISPLAY DEVICE

(71) Applicant: BOE TECHNOLOGY GROUP CO., LTD., Beijing (CN)

(72) Inventors: Dongsheng Li, Beijing (CN); Kuanta Huang, Beijing (CN); Shengji Yang, Beijing (CN); Pengcheng Lu, Beijing (CN); Yunlong Li, Beijing (CN); Qing Wang, Beijing (CN); Yongfa Dong, Beijing (CN); Xiaobin Shen, Beijing (CN); Hui Tong, Beijing (CN); Xiong Yuan, Beijing (CN); Yu Wang, Beijing (CN); Xiaochuan Chen, Beijing (CN)

(*) Notice: Subject to any disclaimer, the term of this patent is extended or adjusted under 35 U.S.C. 154(b) by 0 days.

(21) Appl. No.: 17/853,325

(22) Filed: Jun. 29, 2022

(65) Prior Publication Data
US 2022/0328567 A1    Oct. 13, 2022

Related U.S. Application Data

(63) Continuation of application No. 16/970,190, filed as application No. PCT/CN2019/102291 on Aug. 23, 2019.

(51) Int. Cl.
H10K 59/38 (2023.01)
H10K 50/86 (2023.01)
(Continued)

(52) U.S. Cl.
CPC ............ H10K 59/38 (2023.02); H10K 50/86 (2023.02); H10K 59/1201 (2023.02); H10K 59/126 (2023.02); H10K 71/00 (2023.02)

(58) Field of Classification Search
CPC .... H10K 59/38; H10K 50/86; H10K 59/1201; H10K 59/126; H10K 71/00; H10K 59/12
See application file for complete search history.

(56) References Cited

U.S. PATENT DOCUMENTS 8,004,635 B2 * 8/2011 Lee .................. G02F 1/133514
349/110
2010/0177417 A1    7/2010 Jang et al.
(Continued)

FOREIGN PATENT DOCUMENTS

CN    108878687 A    11/2018
JP    2008292619 A    12/2008
(Continued)

OTHER PUBLICATIONS

Search report issued for European Application No. 19933200.8, dated Aug. 10, 2022, 8 pages.
(Continued)

*Primary Examiner* — Douglas W Owens
(74) *Attorney, Agent, or Firm* — Raj S. Dave; Dave Law Group LLC

(57) ABSTRACT

A light-emitting diode display panel, a manufacturing method thereof, and an organic light-emitting diode display device are provided. The light-emitting diode display panel includes: a base substrate including a display region and a peripheral region surrounding the display region; a plurality of sub-pixels located in the display region and located at a side of the base substrate; a color-resistance layer located at a side of a second electrode in the sub-pixel away from the base substrate; and a light-blocking structure located in the peripheral region and being an annular structure surrounding the plurality of sub-pixels. The light-blocking structure includes a first light-blocking structure and a second light-blocking structure. The first light-blocking structure includes at least one interval extending in a direction from the display region pointing to the peripheral region. The second light-blocking structure at least fully fills the interval.

13 Claims, 8 Drawing Sheets

(51) Int. Cl.
*H10K 59/12* (2023.01)
*H10K 59/126* (2023.01)
*H10K 71/00* (2023.01)

(56) References Cited

U.S. PATENT DOCUMENTS

| | | |
|---|---|---|
| 2016/0079311 A1 | 3/2016 | Lim et al. |
| 2017/0077169 A1 | 3/2017 | Masuda et al. |
| 2018/0040681 A1 | 2/2018 | Sakairi et al. |
| 2018/0095195 A1 | 4/2018 | Kim et al. |
| 2019/0056613 A1 | 2/2019 | Wang et al. |

FOREIGN PATENT DOCUMENTS

| | | | |
|---|---|---|---|
| JP | 2015170702 A | 9/2015 |
| JP | 2016157566 A | 9/2016 |
| JP | 2019091716 A | 6/2019 |
| KR | 20100083456 A | 7/2010 |
| KR | 20140059948 A | 5/2014 |

OTHER PUBLICATIONS

Office action issued for JP Application No. 2021-570540, dated Apr. 13, 2023, 12 pages.

\* cited by examiner

LIGHT-EMITTING DIODE DISPLAY PANEL, MANUFACTURING METHOD THEREOF, AND DISPLAY DEVICE

CROSS-REFERENCE TO RELATED APPLICATIONS

This application is the continuation of U.S. patent application Ser. No. 16/970,190, Aug. 14, 2020, which is the U.S. National Stage Entry of PCT/CN2019/102291, filed on Aug. 23, 2019, the entire disclosures of which are incorporated herein by reference as part of the disclosure of this application.

TECHNICAL FIELD

At least one embodiment of the present disclosure relates to a light-emitting diode display panel, a manufacturing method thereof, and an organic light-emitting diode display device.

BACKGROUND

At present, a silicon-based active matrix organic light-emitting diode (AMOLED) generally adopts a white organic light-emitting diode (WOLED) and a color filter (CF) to achieve colored display. Micro-display devices including silicon-based active-matrix organic light-emitting diodes have a broad market application space, and are particularly suitable for use in helmet-mounted displays, stereoscopic display mirrors, and eyeglass-type displays.

SUMMARY

At least one embodiment of the present disclosure provides a light-emitting diode display panel, a manufacturing method thereof, and an organic light-emitting diode display device. The light-emitting diode display panel includes: a base substrate including a display region and a peripheral region surrounding the display region; a plurality of sub-pixels located in the display region and located at a side of the base substrate, and at least one of the plurality of sub-pixels including: a light-emitting element including a first electrode, a light-emitting functional layer and a second electrode that are stacked in sequence, the first electrode being closer to the base substrate than the second electrode to the base substrate; and a driving circuit, located between the base substrate and the light-emitting element, the driving circuit including a driving transistor and a storage capacitor, the driving transistor including a source electrode, a drain electrode, and a gate electrode, the source electrode or the drain electrode being coupled to the first electrode, the gate electrode being coupled to the storage capacitor, the storage capacitor being configured to store a data signal; a color-resistance layer, located at a side of the second electrode away from the base substrate, light emitted from the light-emitting element passing through the color-resistance layer to exit; and a light-blocking structure, located in the peripheral region and being an annular structure surrounding the plurality of sub-pixels. The light-blocking structure includes a first light-blocking structure and a second light-blocking structure, the first light-blocking structure includes at least one first interval extending in a direction from the display region pointing to the peripheral region, and the second light-blocking structure at least fully fills the at least one first interval.

In some examples, a plurality of first intervals are provided, and the plurality of first intervals are uniformly distributed along a circumferential direction of the annular structure.

In some examples, the color-resistance layer includes a plurality of sub-color-resistance layers in a one-to-one correspondence with the plurality of sub-pixels, and adjacent ones of the plurality of sub-color-resistance layers are at least partially not overlapped with each other; the plurality of sub-color-resistance layers include a plurality of first sub-color-resistance layers, and the plurality of first sub-color-resistance layers and the first light-blocking structure are arranged in a same layer and made of a same material.

In some examples, an outer contour of the first light-blocking structure includes a first side extending in a first direction and a second side extending in a second direction, and the first direction is intersected with the second direction; at least one selected from the group consisting of the first side and the second side includes the at least one first interval; and in an extension direction of the first side or the second side where the at least one first interval is located, a width of the at least one first interval is not less than a width of one of the plurality of first sub-color-resistance layers.

In some examples, the plurality of sub-color-resistance layers further include a plurality of second sub-color-resistance layers, and the plurality of second sub-color-resistance layers and the second light-blocking structure are arranged in a same layer and made of a same material.

In some examples, the second light-blocking structure includes a plurality of second intervals configured to communicate the display region with a region outside the peripheral region, and orthographic projections of the plurality of second intervals on the base substrate are at least partially overlapped with orthographic projections of the plurality of first intervals on the base substrate.

In some examples, the light-blocking structure further includes a third light-blocking structure, and the third light-blocking structure at least fully fills the plurality of second intervals.

In some examples, at least a part of the second light-blocking structure covers the first light-blocking structure, and a surface of the third light-blocking structure away from the base substrate is flush with a surface of the second light-blocking structure away from the base substrate, and wherein the second light-blocking structure is located on the first light-blocking structure.

In some examples, the second light-blocking structure fully fills the at least one first interval, and a surface of the second light-blocking structure away from the base substrate is flush with a surface of the first light-blocking structure away from the base substrate; the light-blocking structure further includes a third light-blocking structure, and the third light-blocking structure is located at a side of the second light-blocking structure and the first blocking structure away from the base substrate and has an enclosed annular shape.

In some examples, the plurality of sub-color-resistance layers further include a plurality of third sub-color-resistance layers, and the plurality of third sub-color-resistance layers and the third light-blocking structure are arranged in a same layer and made of a same material.

In some examples, each of the plurality of first sub-color-resistance layers, each of the plurality of second sub-color-resistance layers, and each of the plurality of third sub-color-resistance layers are color filter layers of different colors.

In some examples, the light-blocking structure only includes the first light-blocking structure and the second light-blocking structure, and the second light-blocking structure fully fills the at least one first interval and has an enclosed annular shape; the plurality of sub-color-resistance layers further include a plurality of fourth sub-color-resistance layers, and a material of the plurality of fourth sub-color-resistance layers is different from that of the first light-blocking structure and is different from that of the second light-blocking structure; each of the plurality of first sub-color-resistance layers, each of the plurality of second sub-color-resistance layers, and each of the plurality of fourth sub-color-resistance layers are color filter layers of different colors.

In some examples, the fourth sub-color-resistance layer and the first sub-color-resistance layer are at least partially overlapped with each other; and in a part of the fourth sub-color-resistance layer that is overlapped with a part of the first sub-color-resistance layer, the fourth sub-color-resistance layer is located at a side of the first sub-color-resistance layer close to the base substrate.

In some examples, the light-blocking structure covers a part of the second electrode.

In some examples, the first side and the second side are connected by an arc-shaped side, and the arc-shaped side is curved in a direction away from the display region.

In some examples, the light-emitting diode display panel further includes: a sensing region located in the peripheral region, and an orthographic projection of the sensing region on the base substrate is located within an orthographic projection of the light-blocking structure on the base substrate.

In some examples, the base substrate is a silicon substrate.

In some examples, at least a part of the driving transistor is located in the silicon substrate.

In some examples, a first thin-film encapsulation layer is provided at a side of the color-resistance layer facing the base substrate, and a second thin-film encapsulation layer is provided at a side of the color-resistance layer away from the base substrate.

At least one embodiment of the present disclosure provides a manufacturing method of the light-emitting diode display panel described above, including: providing the base substrate; forming the light-emitting element in the display region on the base substrate; coating a first color-resistance material on the light-emitting element; patterning the first color-resistance material to form a first color-resistance layer in the display region, and to form a first light-blocking structure that surrounds the display region and is located in the peripheral region; coating a second color-resistance material on the first color-resistance layer and on the first light-blocking structure; and patterning the second color-resistance material to form a second color-resistance layer that is at least partially not overlapped with the first color-resistance layer and is located in the display region, and to form a second light-blocking structure that surrounds the display region and is located in the peripheral region. Forming the first light-blocking structure includes: patterning the first color-resistance material so that the first light-blocking structure includes the at least one first interval extending in a direction from the display region pointing to the peripheral region. Forming the second light-blocking structure includes: patterning the second color-resistance material so that the second light-blocking structure at least fully fills the at least one first interval.

In some examples, coating the second color-resistance material on the first color-resistance layer and on the first light-blocking structure includes: providing the second color-resistance material in a region outside the first light-blocking structure; and rotating the base substrate so that the second color-resistance material is uniformly coated in the display region and in the peripheral region, wherein at least a part of the second color-resistance material flows through the at least one first interval to an inner side of the first light-blocking structure.

At least one embodiment of the present disclosure provides an organic light-emitting diode display device, including the light-emitting diode display panel described in any of the examples above.

BRIEF DESCRIPTION OF THE DRAWINGS

In order to more clearly illustrate the technical solution of the embodiments of the present disclosure, the drawings of the embodiments will be briefly described in the following. It is obvious that the described drawings below are only related to some embodiments of the present disclosure without constituting any limitation thereto.

DETAILED DESCRIPTION

Figure 1:
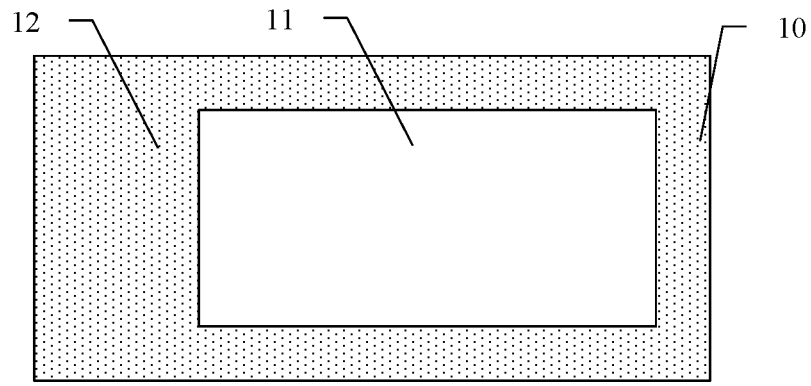
FIG. 1 is a schematic diagram of a partial structure of a color filter structure of a silicon-based organic light-emitting diode display panel.

In order to make objectives, technical details and advantages of the embodiments of the present disclosure more clearly, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

Embodiments of the present disclosure provide a light-emitting diode display panel and a manufacturing method thereof, and an organic light-emitting diode display device. The light-emitting diode display panel includes a base substrate, a plurality of sub-pixels located on the base substrate, and a color-resistance layer and a light-blocking structure that are located at a side of the plurality of sub-pixels away from the base substrate. The base substrate includes a display region and a peripheral region surrounding the display region, and the plurality of sub-pixels are located in the display region. At least one of the plurality of sub-pixels includes: a light-emitting element, including a first electrode, a light-emitting functional layer, and a second electrode that are stacked in sequence, the first electrode is closer to the base substrate than the second electrode to the base substrate; and a driving circuit located between the light-emitting element and the base substrate. The driving circuit includes a driving transistor and a storage capacitor. The driving transistor includes a source electrode, a drain electrode, and a gate electrode. The source electrode or the drain electrodes is coupled to the first electrode, and the gate electrode is coupled to the storage capacitor. The storage capacitor is configured to store a data signal; the color-resistance layer is located at a side of the second electrode away from the base substrate, and the light emitted from the light-emitting element passes through the color-resistance layer to exit; the light-blocking structure is located in the peripheral region and is an annular structure surrounding the plurality of sub-pixels. The light-blocking structure includes a first light-blocking structure and a second light-blocking structure. The first light-blocking structure includes at least one first interval extending in a direction from the display region pointing to the peripheral region. The second light-blocking structure at least fully fills the first interval. In the embodiments of the present disclosure, by designing the shape of the first light-blocking structure as a non-enclosed annular shape, the degree of uniformity of the color filter layer coated in the display region can be higher in the subsequent process of forming other color filter layers, so as to prevent from a phenomenon of nonuniform display occurred in the display device including the light-emitting diode display panel.

The light-emitting diode display panel and the manufacturing method thereof as well as the organic light-emitting diode display device provided by the embodiments of the present disclosure will be described below with reference to the accompanying drawings.

FIG. 1 is a schematic diagram of a partial structure of a color filter structure of a silicon-based organic light-emitting diode display panel provided by an embodiment of the present disclosure. As illustrated in FIG. 1, the organic light-emitting diode display panel includes a display region 11 and a peripheral region 12 surrounding the display region 11. The color filter structure 10 includes a pixel color filter (not illustrated) located in the display region 11 and an annular-shaped bezel color filter (that is, a light-blocking structure) located in the peripheral region 12. The bezel color filter is used to cover a structure in the peripheral region 12 of the display panel, such as an anode wiring for connecting the light-emitting element of the display panel, a pixel sensing circuit, etc., to prevent from light reflection or light leakage in the peripheral region.

For example, in order to achieve a better shielding effect in the peripheral region of the silicon-based organic light-emitting diode display panel, the bezel color filter generally includes at least two layers of color filters that are stacked. In the case where the bezel color filter includes two or three layers of color filters that are stacked, a thickness of the bezel color filter in the peripheral region is 2 to 3 times of that of the pixel color filter in the display region so that a circle of barrier wall would be formed around the display region.

Figure 2A:
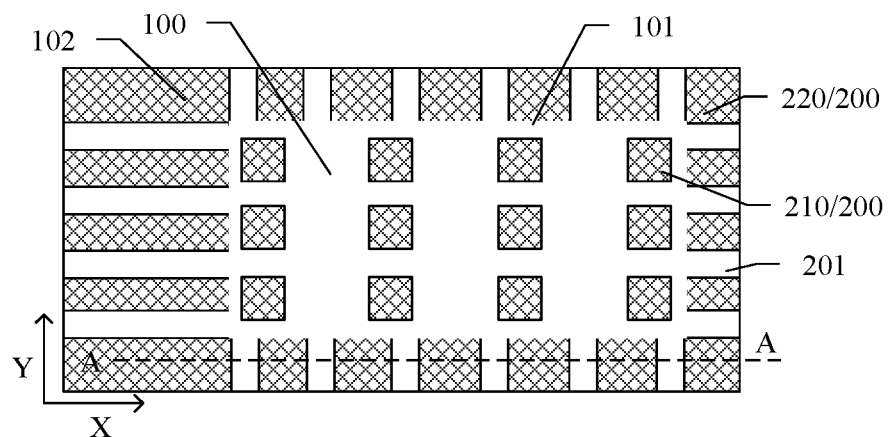
FIG. 2A is a schematic plan view of a structure of a first color filter layer of a color filter structure provided by an example of an embodiment of the present disclosure.
Figure 2B:
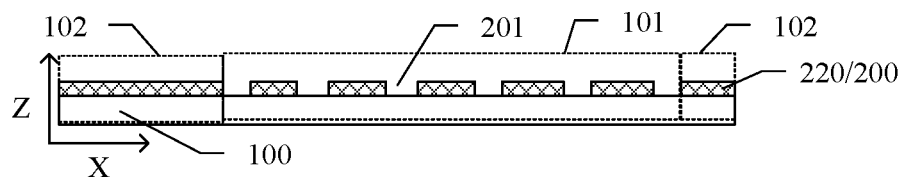
FIG. 2B is a schematic cross-sectional view of a structure of the first color filter layer illustrated in FIG. 2A taken along line AA.

FIG. 2A is a schematic plan view of a structure of a first color filter layer of a color filter structure provided by an embodiment of the present disclosure, and FIG. 2B is a schematic cross-sectional view of a structure of the first color filter layer illustrated in FIG. 2A taken along line AA. As illustrated in FIG. 2A and FIG. 2B, the color filter structure includes a transparent base layer 100 and a first color filter layer 200 located on the transparent base layer 100. The transparent base layer 100 includes a display region 101 and a peripheral region 102 surrounding the display region 101. For example, the display region 101 is a region for displaying an image, that is, a light-emitting region; the peripheral region 102 is a region where no image is displayed, that is, a non-light-emitting region.

As illustrated in FIG. 2A and FIG. 2B, the first color filter layer 200 includes a first pixel color filter 210 located in the display region 101 and a first bezel color filter 220 located in the peripheral region 102. The first bezel color filter 220 is an annular-shaped color filter surrounding the display region 101, and is used to cover a structure in the peripheral region of the display panel including the color filter structure as described above, such as a wire for connecting the light-emitting element, and a sensing circuit structure (the sensing circuit structure can be connected with a temperature sensor) located in the sensing region and configured to detect an electric current of a pixel, etc., to prevent from light reflection or light leakage in the peripheral region. That is, the light-emitting diode display panel provided by the embodiment of the present disclosure includes a color-resistance layer located in the display region 101, the color-resistance layer includes a plurality of sub-color-resistance layers in a one-to-one correspondence with the plurality of sub-pixels, and adjacent ones of the plurality of sub-color-resistance layers are at least partially not overlapped with each other; the plurality of sub-color-resistance layers include a plurality of first sub-color-resistance layers. The following description of the embodiments of the present disclosure is described with reference to the case where the first sub-color-resistance layer is the first pixel color filter 210, and the first light-blocking structure included in the light-emitting diode display panel is the first bezel color filter 220, by way of example. For example, the plurality of first sub-color-resistance layers and the first light-blocking structure are arranged in the same layer and made of the same material. That is, the first sub-color-resistance layer and the first light-blocking structure may both be parts of the first color filter layer 200, respectively. The "same layer" appeared here and later refers to a relationship between multiple film layers formed of the same material by the same process (for example, a single patterning process). The "same layer" here does not always refers to that the multiple film layers have the same thickness or that the multiple film layers have the same height in the cross-sectional view.

For example, each sub-color-resistance layer is configured to filter the light emitted from each sub-pixel, so that light of a specific color can be emitted to realize colored display. For a more detailed structural example of the sub-pixel, please refer to the description below in conjunction with FIG. 9.

As illustrated in FIG. 2A and FIG. 2B, a shape of the first bezel color filter 220 is a non-enclosed annular shape, that is, the first bezel color filter 220 includes at least one first interval 201 configured to communicate the display region 101 with a region outside the peripheral region 102. That is, the first interval 201 extends in a direction from the display region 101 pointing to the peripheral region 102. Compared with the bezel color filter with an enclosed annular shape illustrated in FIG. 1, in at least one embodiment of the present disclosure, by designing the shape of the first bezel color filter as a non-enclosed shape, in a subsequent process of forming other color filter layers, the color filter material dripped at an outer side of the first bezel color filter can flow through the first interval of the first bezel color filter during a spin-coating process and can be coated in the display region in a better way, so that the degree of uniformity of the color filter layer coated in the display region in the subsequent coating process is higher, and the phenomenon of nonuniform display occurred in the display device including the color filter structure can be avoided.

In some examples, as illustrated in FIG. 2A and FIG. 2B, the first bezel color filter 220 includes a plurality of first intervals 201 configured to communicate the display region 101 with a region outside the peripheral region 102.

In an actual process, multiple light-emitting diode display panels are manufactured at the same time, that is, multiple color filter structures on the multiple light-emitting diode display panels are manufactured at the same time, and description is made with reference to the case where each color filter structure is located in one color filter structure region, by way of example. In the embodiment of the present disclosure, because the first bezel color filter is provided with a plurality of first intervals, the color filter material that flows through the first interval and enters into the display region of a certain color filter structure region can flow out of the display region through another first interval and then flow into a display region of another color filter structure region adjacent to the certain color filter structure region, so that the color filter layer in the display region of the plurality of color filter structure regions has a higher degree of uniformity, and the phenomenon of nonuniform display occurred in the above-mentioned multiple display devices with multiple color filter structures can be avoided.

For example, as illustrated in FIG. 2A, an outer ring (that is, an outer contour) of the first bezel color filter 220 may be a right-angled rectangle, that is, the outer ring of the first bezel color filter 220 is a rectangle with all four corners at right angles. That the outer ring of the first bezel color filter 220 is a rectangle refers to that an outer contour of the annular-shaped first bezel color filter is rectangular.

For example, as illustrated in FIG. 2A and FIG. 2B, the first pixel color filter 210 located in the display region 101 includes a plurality of first sub-pixel color filters (that is, a plurality of first sub-color-resistance layers) arranged in an array, and a predetermined space is provided between adjacent first sub-pixel color filters to form subsequent pixel color filters of different colors. In the embodiment of the present disclosure, the first pixel color filter located in the display region is configured to be directly opposite to the sub-pixels in the display panel, so as to achieve a color filter effect on the white light emitted from the light-emitting elements included in the sub-pixels.

Figure 2C:
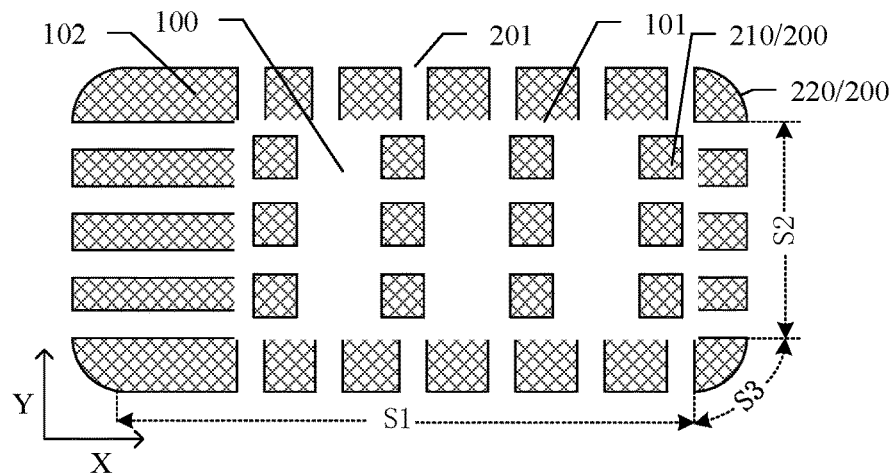
FIG. 2C is a schematic plan view of a structure of a first color filter layer provided by another example of an embodiment of the present disclosure.

For example, FIG. 2C is a schematic plan view of a structure of a first color filter layer provided by an example of an embodiment of the present disclosure. As illustrated in FIG. 2C, an outer ring of the first light-blocking structure 220 includes two first sides S1 extending in a first direction (i.e., X direction) and two second sides S2 extending in a second direction (i.e., Y direction); the first direction is intersected with the second direction; the first side and the second side are connected by an arc-shaped side S3, and the arc-shaped side S3 is curved in a direction away from the display region 101. For example, the first direction may be perpendicular to the second direction. In the case where the first light-blocking structure 220 includes a plurality of first intervals 201, the first side S1 and the second side S2 may both be provided with the first interval 201, so that the first side S1 and the second side S2 are divided into multiple line segments by the first intervals 201, respectively.

For example, as illustrated in FIG. 2C, the outer contour of the first bezel color filter 220 may be a rectangle with rounded corners, that is, the outer ring of the first bezel color filter 220 is a rectangle with all four corners being rounded. An inner ring of the first bezel color filter 220 is determined according to an actually desired shape of the display region 101, for example, it may be a right-angled rectangle, that is, the inner ring of the first bezel color filter 220 is a rectangle with all four corners being right angles. Compared with the bezel color filter illustrated in FIG. 1 with an outer ring having sharp corners, in the embodiments of the present disclosure, by designing the outer ring of the first bezel color filter as a rounded rectangle, it reduces the probability that the color filter material dripped at the outer side of the first bezel color filter becomes divergent due to the sharp corners of the first bezel color filter during a spin-coating process in the subsequent process of forming other color filter layers, thereby further improving the degree of uniformity of the color filter layer coated in the display region, and avoiding the phenomenon of nonuniform display occurred in the display device including the color filter structure.

Figure 2D:
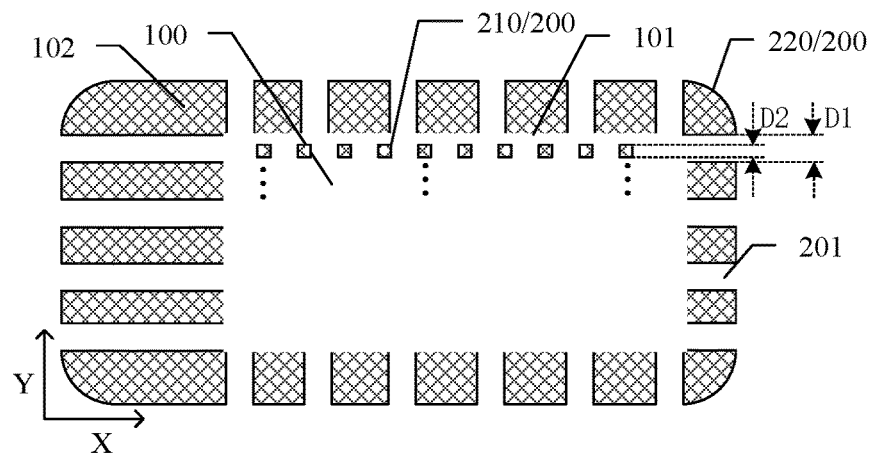
FIG. 2D is a schematic plan view of a structure of a first color filter layer provided by another example of an embodiment of the present disclosure.

The size of the first interval and of the first pixel color filter in the above examples are only illustrative, and can be set according to actual needs. For example, FIG. 2D is a schematic plan view of a structure of a first color filter layer provided by another example of an embodiment of the present disclosure. As illustrated in FIG. 2D, a width of the first interval along a circumferential direction of the annular structure of the first bezel color filter 220 is not less than a width of the first pixel color filter 210 along the circumferential direction of the annular structure of the first bezel color filter 220, so that the color filter material located at an outer side of the first bezel color filter is easier to flow through the first interval and enter into the display region of the color filter structure region in the subsequent process of forming other color filter layers. That is, along the circumferential direction (including the first direction and the second direction) of the annular structure, a width D1 of the first interval 201 is not less than a width D2 of the first sub-color-resistance layer. For example, in the case where the first interval 201 is located at the second side S2, along an extension direction of the second side S2 (i.e., the Y direction), the width D1 of the first interval 201 is not less than the width D2 of the first sub-color-resistance layer.

For example, the width of the first sub-color-resistance layer along the annular-shaped circumferential direction of the first bezel color filter 220 may be less than 10 microns, then the width of the first interval 201 along the annular-shaped circumferential direction of the first bezel color filter 220 may be less than 10 microns.

For example, as illustrated in FIG. 2A-FIG. 2D, a plurality of first intervals 201 are uniformly distributed along the annular-shaped circumferential direction, so that in the subsequent process of forming other color filter layers, the color filter material located at an outer side of the first bezel color filter can pass through the first intervals more uniformly to enter into the display region of the color filter structure region and flow out of the display region more uniformly through the first intervals.

Figure 3A:
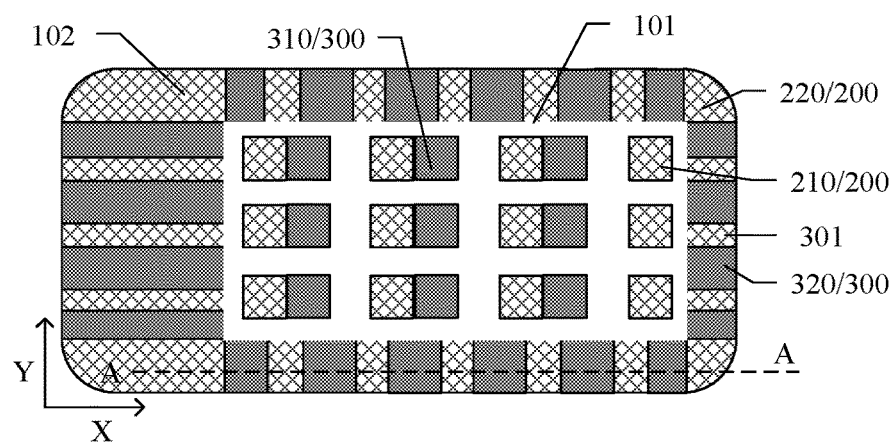
FIG. 3A is a schematic plan view of a structure of a second color filter layer in an example of an embodiment of the present disclosure.
Figure 3B:
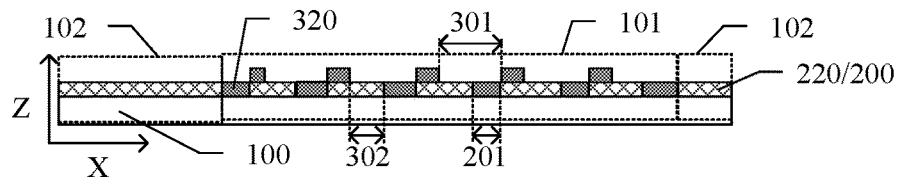
FIG. 3B is a schematic cross-sectional view of a structure of the second color filter layer illustrated in FIG. 3A taken along line AA.

FIG. 3A is a schematic plan view of a structure of a second color filter layer in an example of an embodiment of the present disclosure, and FIG. 3B is a schematic cross-sectional view of a structure of the second color filter layer illustrated in FIG. 3A taken along line AA. FIG. 3A schematically illustrates that an outer ring of the first color filter layer is a rectangle with rounded corners without limited thereto, and the outer ring of the first color filter layer may also be a rectangle with right angles.

As illustrated in FIG. 3A and FIG. 3B, the color filter structure further includes a second color filter layer 300. The second color filter layer 300 includes: a second pixel color filter 310 that is located in the display region 101 and is at least partially not overlapped with the first pixel color filter 210; and a second bezel color filter 320 located in the peripheral region 102. That is, the light-blocking structure further includes a second light-blocking structure, and the plurality of sub-color-resistance layers further include a plurality of second sub-color-resistance layers. The following embodiments of the present disclosure are described with reference to the case where the second pixel color filter is the second sub-color-resistance layer, and the second bezel color filter is the second light-blocking structure, by way of example. For example, the plurality of second sub-color-resistance layers and the second light-blocking structure are arranged in the same layer and made of the same material. That is, the second sub-color-resistance layer and the second light-blocking structure are two film layers formed by performing the same patterning process on a second color-resistance material.

In the embodiment of the present disclosure, by arranging a plurality of first intervals in the first bezel color filter, during the subsequent process of forming the second color filter layer, it may allow a second color filter material that flows through the first interval and enters into the display region of a certain color filter structure to flow out of the display region through another first interval and then flow into a display region of another color filter structure region adjacent to the certain color filter structure, so that the second color filter layer in the display region of the plurality of color filter structure regions has a higher degree of uniformity.

FIG. 3A and FIG. 3B schematically illustrate that the second pixel color filter 310 is in contact with the first pixel color filter 210, without limited thereto. For example, the second pixel color filter may also be partially overlapped with the first pixel color filter, and an overlap portion of the second pixel color filter and the first pixel color filter can play a role of light-shielding and anti-reflection, thereby omitting a black matrix. For example, the second pixel color filter may also be separated from the first pixel color filter, and a black matrix is arranged in a space between the second pixel color filter and the first pixel color filter to prevent from crosstalk.

For example, as illustrated in FIG. 3A and FIG. 3B, the second pixel color filter 310 includes a plurality of second sub-pixel color filters (i.e., a plurality of second sub-color-resistance layers); the second sub-pixel color filter and the first sub-pixel color filter are at least partially not overlapped with each other; a side surface of the second sub-pixel color filter can be in contact with the first sub-pixel color filter, and the other side surface of the second sub-pixel color filter that is opposite to the above-mentioned side surface and the first sub-pixel color filter have a certain space there-between so as to form, in a subsequent process, a pixel color filter having a color different from both the first pixel color filter and the second pixel color filter. Of course, the embodiment of the present disclosure is not limited thereto, and the first sub-pixel color filter and the second sub-pixel color filter may be alternately arranged and be in contact with each other.

As illustrated in FIG. 3A and FIG. 3B, the second bezel color filter 320 at least fully fills the plurality of first intervals 201 to achieve light shielding and anti-reflective effects.

In some examples, as illustrated in FIG. 3A and FIG. 3B, the second bezel color filter 320 includes a plurality of second intervals 301 configured to communicate the display region 101 with a region outside the peripheral region 102, and at least part of orthographic projections of the plurality of second intervals 301 on the transparent base layer are overlapped with orthographic projections of the plurality of first intervals 201 on the transparent base layer 100.

For example, in the example illustrated in FIG. 3B, an orthographic projection of the second bezel color filter 320 on the transparent base layer 100 includes a plurality of intervals 302, and an orthographic projection of the first interval 201 on the transparent base layer 100 is not overlapped with the interval 302, so that the second bezel color filter 320 at least fully fills the plurality of first intervals 201. In this example, the second interval 301 is consisted of the first interval 201 and the interval 302. In the process of forming the second bezel color filter 320 on the first bezel color filter 220, a part of the second bezel color filter 320 fully fills the first interval 201 while the other part of the second bezel color filter 320 is located on the first bezel color filter 220; the part of the second bezel color filter 320 that is located on the first bezel color filter 220 includes a plurality of sub-portions, and a gap between adjacent sub-portions is the second interval 301. In addition, the second bezel color filter 320 located on the first bezel color filter 220 cooperates with the first bezel color filter 220 to play a role of light-shielding and anti-reflection.

Figure 4A:
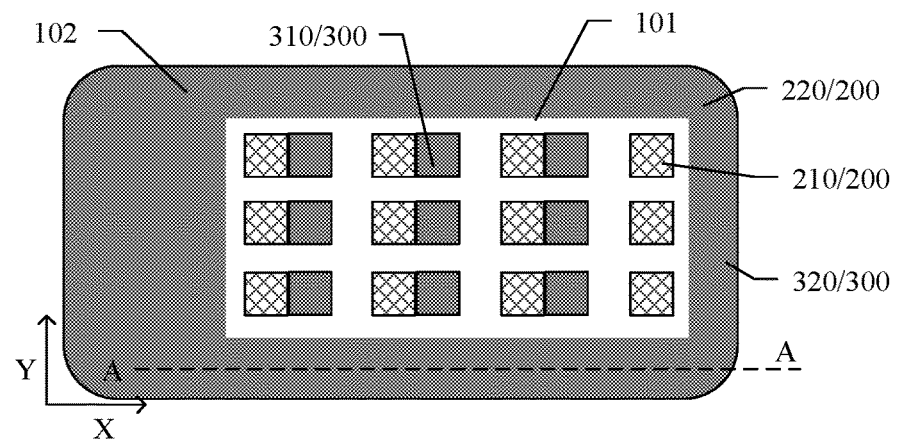
FIG. 4A is a schematic plan view of a structure of a second color filter layer in another example of an embodiment of the present disclosure.
Figure 4B:
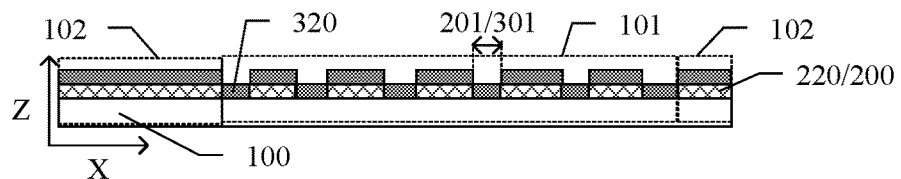
FIG. 4B is a schematic cross-sectional view of a structure of the second color filter layer illustrated in FIG. 4A taken along line AA.

FIG. 4A is a schematic plan view of a structure of a second color filter layer in another example of an embodiment of the present disclosure, and FIG. 4B is a schematic cross-sectional view of a structure of the second color filter layer illustrated in FIG. 4A taken along line AA. FIG. 4A schematically illustrates that an outer ring of the second color filter layer is a rectangle with rounded corners without limited thereto, and may also be a rectangle with right angles. The second pixel color filter illustrated in FIG. 4A has the same characteristics and effects as the second pixel color filter illustrated in FIG. 3A, without repeated here. The second bezel color filter illustrated in FIG. 4A and FIG. 4B is different from the second bezel color filter in the example illustrated in FIG. 3A in that: the second bezel color filter 320 (i.e., the second light-blocking structure) in this example has an enclosed annular shape. For example, a shape of an orthographic projection of the second bezel color filter 320 on the transparent base layer 100 is an enclosed annular shape (closed ring), that is, the orthographic projection of the second bezel color filter 320 on the transparent base layer 100 has no interval. For example, in this example, the orthographic projection of the first bezel color filter 220 on the transparent base layer 100 is completely located within the orthographic projection of the second bezel color filter 320 on the transparent base layer 100. That is, the second light-blocking structure in this example completely covers the first light-blocking structure. The second bezel color filter 320 fully fills the first interval 201 and completely covers the first bezel color filter 220.

For example, as illustrated in FIG. 4A and FIG. 4B, the second bezel color filter 320 includes a plurality of second intervals 301, and an orthographic projection of the second interval 301 on the transparent base layer 100 is completely coincident with that of the first interval 201 on the transparent base layer 100. That is, in the process of forming the second bezel color filter 320 on the first bezel color filter 220, a part of the second bezel color filter 320 fully fills the first interval 201, and the other part of the second bezel color filter 320 is located on the first bezel color filter 220; the part of the second bezel color filter 320 that is located on the first bezel color filter 220 includes a plurality of sub-portions, and a gap between adjacent sub-portions is the second interval 301. In addition, the second bezel color filter 320 located on the first bezel color filter 220 cooperates with the first bezel color filter 220 to play a role of light-shielding and anti-reflection.

In the example illustrated in FIG. 3A-FIG. 4B, because the second bezel color filter is designed to include the shape of the second interval, in a subsequent process of forming other color filter layers, a color filter material that flows through the second interval to enter into the display region of a certain color filter structure region can flow out of the display region through another second interval and then flow into a display region of another color filter structure region adjacent to the certain color filter structure region, so that the color filter layer in the display region of the plurality of color filter structure regions has a relatively higher degree of uniformity, and the phenomenon of nonuniform display occurred in the display devices including the color filter structures as described above is avoided.

Figure 5A:
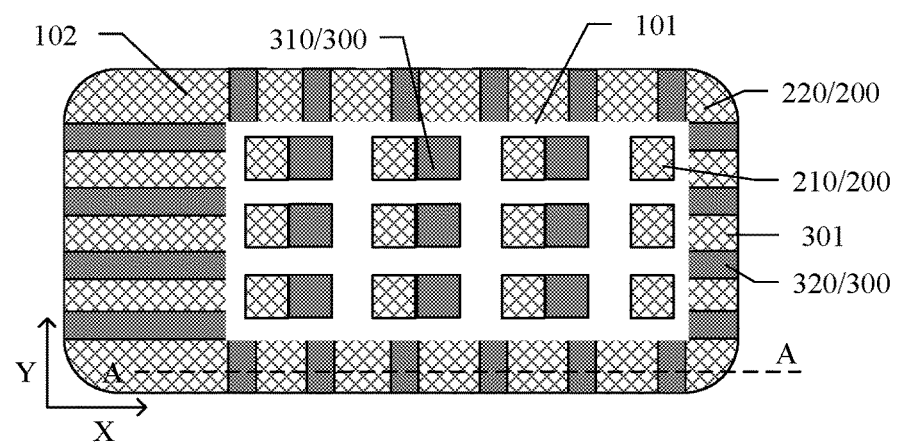
FIG. 5A is a schematic plan view of a structure of a second color filter layer in another example of an embodiment of the present disclosure.
Figure 5B:
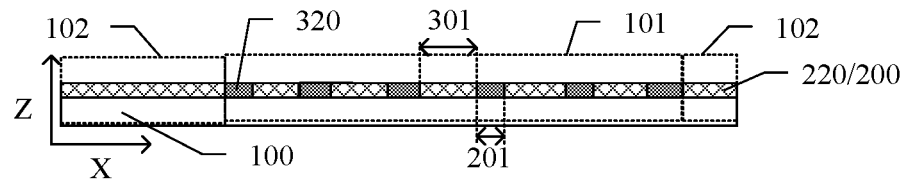
FIG. 5B is a schematic cross-sectional view of a structure of the second color filter layer illustrated in FIG. 5A taken along line AA.

FIG. 5A is a schematic plan view of a structure of a second color filter layer in another example of an embodiment of the present disclosure, and FIG. 5B is a schematic cross-sectional view of a structure of the second color filter layer illustrated in FIG. 5A taken along line AA. FIG. 5A schematically illustrates that an outer ring of the first color filter layer is a rectangle with rounded corners without limited thereto, and it may also be a rectangle with right angles. The second pixel color filter illustrated in FIG. 5A has the same characteristics and effects as the second pixel color filter illustrated in FIG. 3A, without repeated here. The second bezel color filter illustrated in FIG. 5A and FIG. 5B is different from the second bezel color filter in the example illustrated in FIG. 3A in that: the second bezel color filter 320 (i.e., the second light-blocking structure) in this example only fully fills the first interval 201, that is, a pattern of the second bezel color filter 320 is complementary to a pattern of the first bezel color filter 220. That is, the second bezel color filter 320 includes a plurality of second intervals 301, and the first bezel color filter 220 fully fills the second intervals 301 to form an enclosed annular-shaped bezel color filter for light-shielding and anti-reflection.

For example, as illustrated in FIG. 5A and FIG. 5B, a surface of the second bezel color filter 320 away from the transparent base layer 100 is flush with a surface of the first bezel color filter 220 away from the transparent base layer 100 to form a flat surface. That is, the second light-blocking structure 320 fully fills the first interval 201, and a surface of the second light-blocking structure 320 away from the transparent base layer 100 is flush with a surface of the first light-blocking structure 220 away from the transparent base layer 100.

In the example illustrated in FIG. 5A-FIG. 5B, because the first bezel color filter and the second bezel color filter only form one layer of bezel color filter, a thickness of the bezel color filter can be reduced; thus, in a subsequent process for forming other color filter layers, the color filter material dripped at an outer side of the first bezel color filter can be uniformly coated in the display region during the spin-coating process, so that the degree of uniformity of the color filter layer coated in the display region is higher, and the phenomenon of nonuniform display in the display device including the color filter structure can be avoided.

Figure 6A:
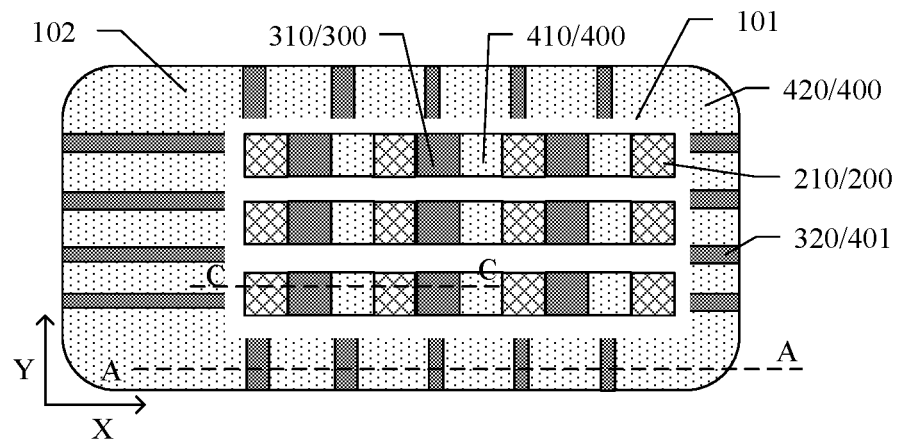
FIG. 6A is a schematic plan view of a structure of a third color filter layer in an example of an embodiment of the present disclosure.
Figure 6B:
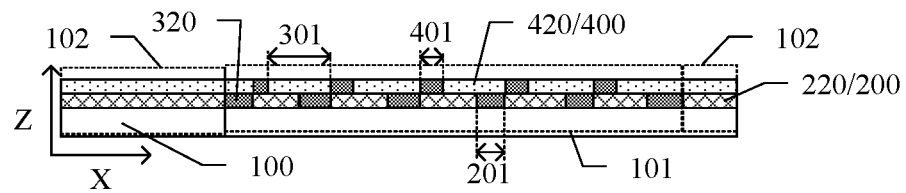
FIG. 6B is a schematic cross-sectional view of a structure of the third color filter layer illustrated in FIG. 6A taken along line AA.

FIG. 6A is a schematic plan view of a structure of a third color filter layer in an example of an embodiment of the present disclosure, and FIG. 6B is a schematic cross-sectional view of a structure of the third color filter layer illustrated in FIG. 6A taken along line AA. FIG. 6A schematically illustrates that an outer ring of the third color filter layer is a rectangle with rounded corners without limited thereto, and it can also be a rectangle with right angles.

As illustrated in FIG. 6A and FIG. 6B, the color filter structure further includes: a third color filter layer 400. The third color filter layer 400 includes a third pixel color filter 410 located in the display region 101; the third pixel color filter 410 is at least partially not overlapped with the first pixel color filter 210 and is at least partially not overlapped with the second pixel color filter 310. The third color filter layer 400 further includes a third bezel color filter 320 located in the peripheral region 102. That is, the light-blocking structure further includes a third light-blocking structure, and the plurality of sub-color-resistance layers further include a plurality of third sub-color-resistance layers. The following embodiments of the present disclosure are described with reference to the case where the third bezel color filter 420 is the third light-blocking layer, and the third pixel color filter 410 is the third sub-color-resistance layer, by way of example. For example, the plurality of third sub-color-resistance layers and the third light-blocking structure are arranged in the same layer and made of the same material. That is, the third sub-color-resistance layer and the third light-blocking structure are two film layers formed by performing the same patterning process on a third color-resistance material.

In the embodiment of the present disclosure, by arranging a plurality of second intervals in the second bezel color filter, in a subsequent process of forming the third color filter layer, it allows a third color filter material that flows through the second interval and enters into the display region of a certain color filter structure region to flow out of the display region through another second interval and then flow into a display region of another color filter structure region adjacent to the certain color filter structure, so that the degree of uniformity of the third color filter layer in the display region of the plurality of color filter structure regions is higher.

FIG. 6A and FIG. 6B schematically illustrate that the third pixel color filter 410 is in contact with the first pixel color filter 210 and the second pixel color filter 310, respectively, without limited thereto. For example, the third pixel color filter may also be partially overlapped with the second pixel color filter and the first pixel color filter, respectively, and the above-mentioned overlap portion can play the role of light-shielding and anti-reflection, thereby omitting a black matrix. For example, the third pixel color filter may also be separated from the second pixel color filter and be separated from the first pixel color filter, and a space between adjacent pixel color filters is provided with a black matrix to prevent from crosstalk.

For example, as illustrated in FIG. 6A and FIG. 6B, the third pixel color filter 410 includes a plurality of third sub-pixel color filters (that is, the third sub-color-resistance layer), and a side surface of the third sub-pixel color filter may be in contact with the first sub-pixel color filter while the other side surface of the third sub-pixel color filter is in contact with the second sub-pixel color filter.

For example, FIG. 6A and FIG. 6B illustrate the third bezel color filter formed on the second bezel color filter in the example illustrated in FIG. 3A and FIG. 3B. As illustrated in FIG. 6A and FIG. 6B, the third bezel color filter 420 at least fully fills the plurality of second intervals 301. In addition, an orthographic projection of the first bezel color filter 220 on the transparent base layer 100 is completely located within orthographic projections of the second bezel color filter 320 and the third bezel color filter 420 on the transparent base layer 100. That is, the second bezel color filter 320 and the third bezel color filter 420 completely cover the first bezel color filter 220. In the embodiment of the present disclosure, the first bezel color filter, the second bezel color filter and the third bezel color filter, together, play a role of light-shielding and anti-reflection.

For example, as illustrated in FIG. 6B, the third bezel color filter 420 only fully fills the second interval 301, then the third bezel color filter 420 includes a plurality of third intervals 401, and the third interval 401 is fully filled by the second bezel color filter 320. That is, a shape of the third bezel color filter 420 is complementary to a shape of the second bezel color filter 320 that is located on the first bezel color filter 220.

For example, in the example illustrated in FIG. 6A and FIG. 6B, the third bezel color filter 420 only fully fills the second interval 301 so that a surface of the third bezel color filter 420 away from the transparent base layer 100 is flush with a surface of the second bezel color filter 320 located on the first bezel color filter 220. That is, the second bezel color filter fully fills the first interval of the first bezel color filter, and the third bezel color filter fully fills the second interval of the second bezel color filter, thereby forming a bezel color filter with only two layers, which reduces a thickness of the bezel color filter.

Of course, the embodiments of the present disclosure are not limited to the case where the third bezel color filter only fully fills the second interval, and it may also be the case where an orthographic projection of the third bezel color filter on the transparent base layer has an enclosed annular shape (closed ring), that is, the third bezel color filter is a continuous film layer and completely covers the first bezel color filter and the second bezel color filter, in order to increase a thickness of the bezel color filter in some regions and realize the light-shielding effect in a better way.

For example, in the case where the third bezel color filter is provided in the example illustrated in FIG. 4A-FIG. 4B, the third bezel color filter can either only fully fills the second interval as illustrated in FIG. 6B, or be a continuous film layer that completely covers the first bezel color filter and the second bezel color filter; and the embodiment of the present disclosure is not limited thereto.

Figure 7A:
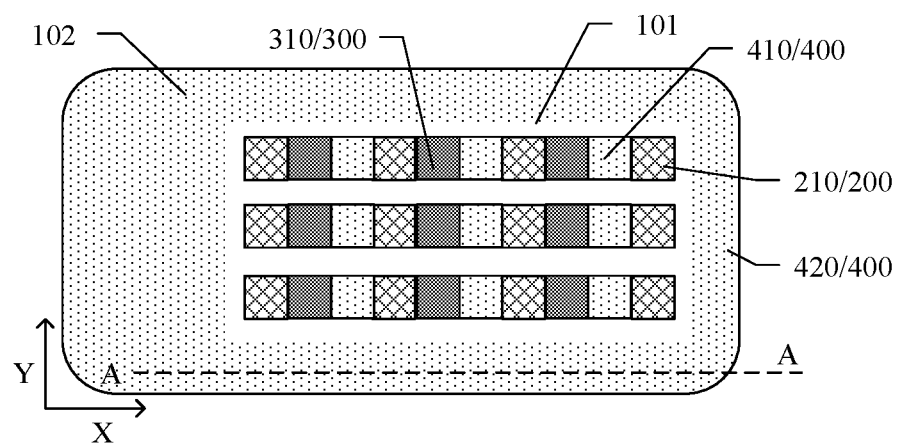
FIG. 7A is a schematic plan view of a structure of a third color filter layer in another example of an embodiment of the present disclosure.
Figure 7B:
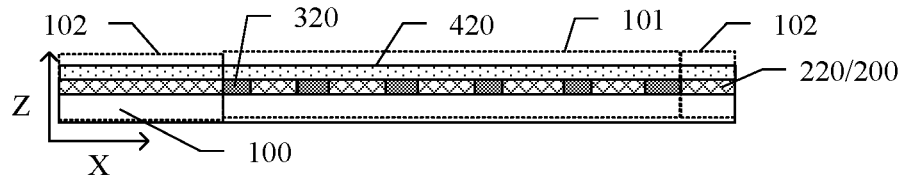
FIG. 7B is a schematic cross-sectional view of a structure of the third color filter layer illustrated in FIG. 7A taken along line AA.

FIG. 7A is a schematic plan view of a structure of a third color filter layer in another example of an embodiment of the present disclosure, and FIG. 7B is a schematic cross-sectional view of a structure of the third color filter layer illustrated in FIG. 7A taken along line AA. FIG. 7A schematically illustrates that an outer ring of the third bezel color filter is a rounded rectangle without limited thereto, and it may also be a right-angled rectangle. The third pixel color filter illustrated in FIG. 7A has the same characteristics and effects as the third pixel color filter illustrated in FIG. 6A, without repeated here.

FIG. 7A and FIG. 7B illustrate the third bezel color filter formed on the second bezel color filter in the example illustrated in FIG. 5A and FIG. 5B. As illustrated in FIG. 7A and FIG. 7B, the third bezel color filter 420 is located at a side of the second bezel color filter 320 and the first bezel color filter 220 away from the transparent base layer 100. An orthographic projection of the third bezel color filter 420 on the transparent base layer 100 is an enclosed annular shape (closed ring), that is, the third bezel color filter 420 is a continuous film layer and completely covers both the first bezel color filter 220 and the second bezel color filter 320, so as to cooperate with the first bezel color filter and the second bezel color filter to play a role of light-shielding and anti-reflection.

In this example, because the first bezel color filter and the second bezel color filter only form one layer of bezel color filter, a thickness of the bezel color filter can be reduced, so that in the subsequent process of forming the third color filter layer, the color filter material dripped at an outer side of the first bezel color filter can be uniformly coated in the display region during the spin-coating process, the third color filter layer coated in the display region has a higher degree of uniformity to prevent from the phenomenon of nonuniform display occurred in the display device including the color filter structure.

In some examples, as illustrated in FIG. 6A-FIG. 7B, the first color filter layer 200, the second color filter layer 300, and the third color filter layer 400 are color filter layers of different colors. That is, the first sub-color-resistance layer, the second sub-color-resistance layer, and the third subcolor-resistance layer are color filter layers of different colors. For example, the first sub-color-resistance layer, the second sub-color-resistance layer, and the third sub-color-resistance layer may be a red color filter layer, a green color filter layer, and a blue color filter layer, respectively.

Figure 8A:
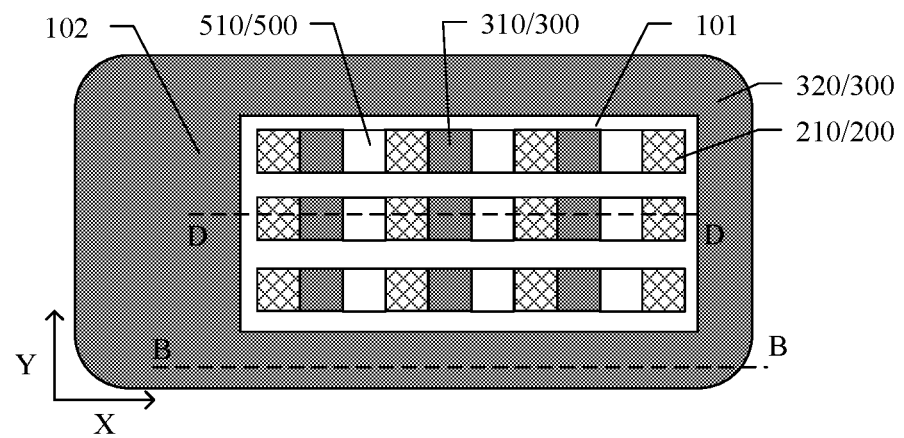
FIG. 8A and FIG. 8B are schematic diagrams of a color filter structure provided by an example of another embodiment of the present disclosure.
Figure 8B:
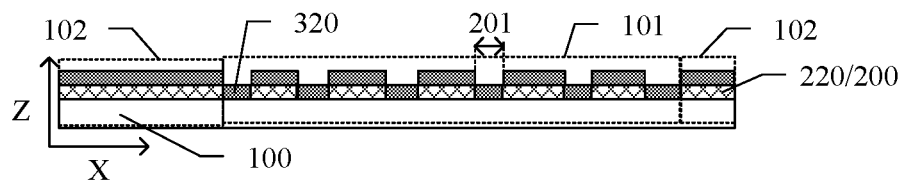

FIG. 8A and FIG. 8B are schematic diagrams of a color filter structure provided by another embodiment of the present disclosure. FIG. 8A is a schematic plan view of a structure of a first color filter layer, a second color filter layer and a fourth color filter layer, and FIG. 8B is a schematic cross-sectional view of a structure of a first bezel color filter and a second bezel color filter illustrated in FIG. 8A taken along line BB. FIG. 3A schematically illustrates that an outer ring of the second color filter layer is a rectangle with rounded corners without limited thereto, and it can also be a rectangle with right angles. As illustrated in FIG. 8A and FIG. 8B, the color filter structure includes: a transparent base layer 100 and a first color filter layer 200 located on the transparent base layer 100. The transparent base layer 100 includes a display region 101 and a peripheral region 102 surrounding the display region 101.

As illustrated in FIG. 8A and FIG. 8B, the first color filter layer 200 includes a first pixel color filter 210 (i.e., a first sub-color-resistance layer) located in the display region 101 and a first bezel color filter 220 (i.e., a first light-blocking structure) located in the peripheral region 102. The shape and effect of the first bezel color filter in the present embodiment of the present disclosure are the same as the shape and effect of the first bezel color filter illustrated in FIG. 2A and FIG. 2B, respectively, without repeated here.

As illustrated in FIG. 8A and FIG. 8B, the color filter structure further includes a fourth color filter layer 500, which only includes a fourth pixel color filter 510 that is located in the display region 101 and is at least partially not overlapped with the first pixel color filter 210. That is, the fourth color filter layer 500 does not include a bezel color filter located in the peripheral region 102; that is, in the case where the display region 101 includes pixel color filters of two colors, the peripheral region 102 includes only one color filter layer, which can reduce a thickness of the bezel color filter in the peripheral region. That is, the light-blocking structure only includes the first light-blocking structure and the second light-blocking structure; the plurality of sub-color-resistance layers further include a plurality of fourth sub-color-resistance layers; a material of the plurality of fourth sub-color-resistance layers is different from that of the first light-blocking structure and is different from that of the second light-blocking structure; and the first sub-color-resistance layer, the second sub-color-resistance layer and the fourth sub-color-resistance layer are color filter layers of different colors. The first sub-color-resistance layer, the second sub-color-resistance layer, and the fourth sub-color-resistance layer may be a red color filter layer, a green color filter layer, and a blue color filter layer, respectively. The colors of the first sub-color-resistance layer and the second sub-color-resistance layer in this embodiment are the same as the colors of the first sub-color-resistance layer and the second sub-color-resistance layer in the foregoing embodiment, respectively. The color of the fourth sub-color-resistance layer in this embodiment can be the same as or different from the color of the third sub-color-resistance layer in the foregoing embodiment. This embodiment is described with reference to the case where the color of the fourth sub-color-resistance layer is the same as that of the third sub-color-resistance layer in the foregoing embodiment, by way of example.

In the embodiment of the present disclosure, the first color filter layer is formed after the fourth color filter layer is formed. Because the fourth color filter layer does not include a bezel color filter (that is, it does not include a light-blocking structure), it will not affect the degree of uniformity of the first color filter layer formed in a subsequent process. In this case, the first pixel color filter formed the display region by the spin-coating process is uniform.

Figure 8C:
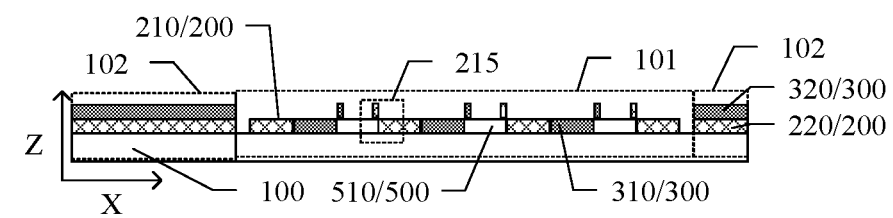
FIG. 8C is a schematic cross-sectional view of a structure of a color filter structure provided by another example of another embodiment of the present disclosure.

FIG. 8A and FIG. 8B schematically illustrate that the fourth pixel color filter 510 is in contact with the first pixel color filter 210, without limited thereto. FIG. 8C is a schematic cross-sectional view of a structure of the color filter structure in the example illustrated in FIG. 8A taken along the line DD, provided by another example of the embodiment of the present disclosure. For example, the fourth pixel color filter 510 may also be partially overlapped with the first pixel color filter 210, and an overlap portion 215 thereof may be served as a light shielding and anti-reflection function, thereby saving a black matrix. For example, in the overlap portion 215 where a part of the fourth pixel color filter 510 and a part of the first pixel color filter 210 are overlapped with each other, the fourth pixel color filter 510 is located at the side of the first pixel color filter 210 close to the transparent base layer 100. That is, the fourth sub-color-resistance layer and the first sub-color-resistance layer are at least partially overlapped with each other, and in the overlap portion where a part of the fourth sub-color-resistance layer and a part of the first sub-color-resistance layer are overlapped with each other, the fourth sub-color-resistance layer is located at a side of the first sub-color-resistance layer close to the transparent base layer, and the embodiments of the present disclosure are not limited thereto. For example, the fourth pixel color filter may also be separated from the first pixel color filter, and a black matrix is provided in a space between the fourth pixel color filter and the first pixel color filter to prevent from crosstalk.

For example, as illustrated in FIG. 8A and FIG. 8B, the color filter structure further includes a second color filter layer 300. The second color filter layer 300 includes: a second pixel color filter 310 that is located in the display region 101 and is at least partially not overlapped with the first pixel color filter 210 and the fourth pixel color filter 510; and a second bezel color filter 320 located in the peripheral region 102. FIG. 8A and FIG. 8B schematically illustrate that the second pixel color filter 310 is in contact with the first pixel color filter 210 and the fourth pixel color filter 510, respectively, without limited thereto. For example, as illustrated in FIG. 8C, the second pixel color filter 310 may also be overlapped with at least one of the first pixel color filter 210 and the fourth pixel color filter 510 to form an overlap portion, and the overlap portion may be served as a light shielding and anti-reflection function, thereby omitting a black matrix. For example, the second pixel color filter may also be separated from the first pixel color filter and the fourth pixel color filter, respectively, and a black matrix is arranged in a space between adjacent pixel color filters to prevent from crosstalk.

For example, as illustrated in FIG. 8A and FIG. 8B, characteristics and effects of the second bezel color filter 320 as well as its positional relationship with respect to the first bezel color filter 220 in the embodiment of the present disclosure are the same as characteristics and effects of the second bezel color filter 320 as well as its positional relationship with respect to the first bezel color filter 220 illustrated in FIG. 4A and FIG. 4B, respectively, without repeated here.

Figure 9:
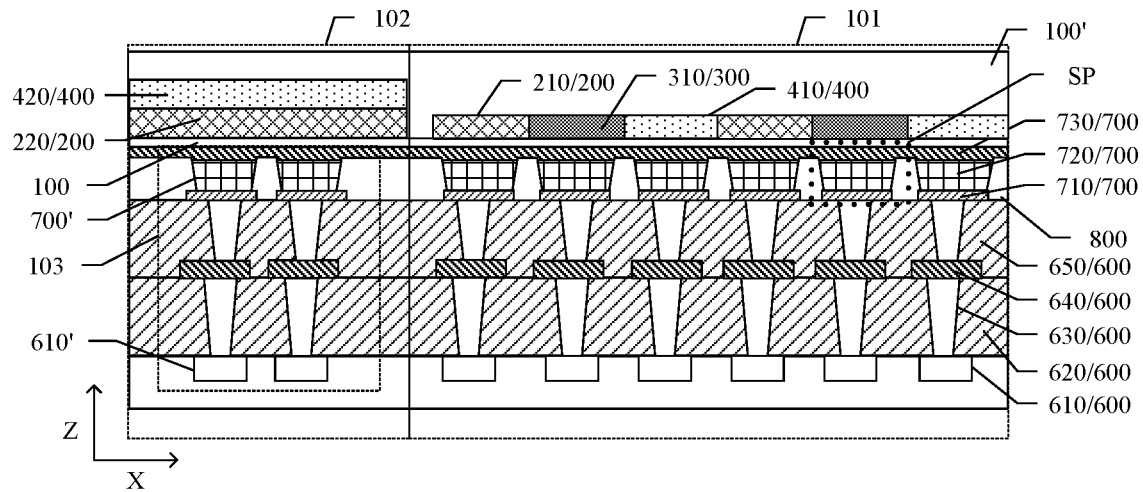
FIG. 9 is a schematic cross-sectional view of a part of a light-emitting diode display panel provided by an embodiment of the present disclosure.

Another embodiment of the present disclosure provides a light-emitting diode display panel. FIG. 9 is a schematic cross-sectional view of a part of a light-emitting diode display panel provided by an embodiment of the present disclosure. FIG. 9 is illustrated with reference to the case where the color filter structure is as illustrated in FIG. 6A, by way of example. FIG. 9 is a schematic cross-sectional view of the light-emitting diode display panel illustrated in FIG. 6A taken along the line CC, without limited thereto. The light-emitting diode display panel provided by the embodiments of the present disclosure may also be the color filter structure in other examples mentioned above, as long as the shape of the first bezel color filter is a non-enclosed annular shape.

As illustrated in FIG. 9, the light-emitting diode display panel includes a base substrate 600, a plurality of sub-pixels located on the base substrate 600, and a color filter structure (such as a color-resistance layer and a light-blocking structure) located on a display side of the plurality of sub-pixels. The light-emitting diode display panel is described with reference to the case where the color filter structure is the color filter structure illustrated in FIG. 6A, by way of example.

As illustrated in FIG. 9, the plurality of sub-pixels are located in the display region 101 and located at a side of the base substrate 600. At least one of the plurality of sub-pixels includes: a light-emitting element 700 and a driving circuit 610 located between the light-emitting element 700 and the base substrate 600. The light-emitting element 700 includes a first electrode 710, a light-emitting functional layer 720, and a second electrode 730 that are stacked in sequence, and the first electrode 710 is closer to the base substrate 600 than the second electrode 730 to the base substrate 600. The driving circuit 610 includes a driving transistor and a storage capacitor. The driving transistor includes a source electrode, a drain electrode, and a gate electrode. The source electrode or the drain electrode is coupled to the first electrode 710, the gate electrode is coupled to the storage capacitor, and the storage capacitor is configured to store a data signal. The color-resistance layer is located at a side of the second electrode 730 away from the base substrate 600, and light emitted from the light-emitting element 700 passes through the color-resistance layer to exit.

FIG. 9 only schematically illustrates the structure of the pixel circuit. For a more detailed structure of the pixel circuit in the examples, please refer to the description in conjunction with FIG. 11 below.

As illustrated in FIG. 9, the light-emitting diode display panel further includes a sensing region 103 located in the peripheral region 102. The sensing region 103 may include a sensing circuit structure configured to detect an electric current of the pixel; the sensing circuit structure may be connected with a temperature sensor, and the sensing circuit structure is located at a side of the color filter structure facing the base substrate 600. An orthographic projection of the sensing region 103 on the transparent base layer 100 is located within an orthographic projection of the first light-blocking structure on the base substrate 600.

As illustrated in FIG. 9, the second electrode 730 of the light-emitting element 700 in the display region may extend to the sensing region 103; and the first bezel color filter 220 (first light-blocking structure), the second bezel color filter 320 (second light-blocking structure) and the third bezel color filter 420 (third light-blocking structure) cover the portion of the second electrode extending to the sensing region (the cross section of the light-blocking structure as illustrated in FIG. 9 only includes the first light-blocking structure and the third light-blocking structure, without limited thereto; the barrier structure at other positions may include a first light-blocking structure and a second light-blocking structure, or include a second light-blocking structure and a third light-blocking structure, or include a first light-blocking structure, a second light-blocking structure and third light-blocking structure). For example, the sensing region 103 includes a light-emitting element 700' and a sensing circuit structure 610' that are arranged in the same layer as the light-emitting element 700 in the display region. The first bezel color filter 220, the second bezel color filter 320, and the third bezel color filter 420 are served as a light-blocking structure to block light emitted from the light-emitting element in the sensing region. In addition, it should be explained that, FIG. 9 only illustrates an exemplary structure in which the first bezel color filter 220 and the third bezel color filter 420 are located in the peripheral region, but the embodiment provided by the present disclosure is not limited thereto. For example, the various color filter structures described in the above embodiments all can be applied to the structure in FIG. 9. That is to say, the color filter structure in FIG. 9 can be replaced by any color filter structure in the foregoing embodiments.

For example, each sub-pixel SP includes a light-emitting element 700, as illustrated by the dashed box illustrated in FIG. 9. Each sub-pixel corresponds to one sub-color-resistance layer, for example, sub-color-resistance layers 210, 310, 410, etc., so that the light emitted from each sub-pixel is filtered by the corresponding color-resistance layer to display a corresponding color.

In some examples, as illustrated in FIG. 9, the base substrate 600 is a silicon substrate 600, and a driving circuit 610 is provided at a side of the silicon substrate 600 facing the light-emitting element 700, and the driving circuit 610 is connected with the light-emitting element 700. For example, the source electrode and drain electrode of the driving transistor in the driving circuit 610 are integrated on the silicon substrate 600.

For example, a gate driver circuit and a data driver circuit (not illustrated in the figure) may also be integrated on the silicon substrate; and a flexible circuit board is provided in the peripheral region of the silicon substrate and is configured to transmit electric signals to the gate driver circuit, the data driver circuit, and the light-emitting element, respectively. For example, the gate driver circuit (not illustrated in the figure) is configured to generate a gate driver signal, and the data driver circuit (not illustrated in the figure) is configured to generate a data signal. The gate driver circuit and the data driver circuit may use the conventional circuit structures in the field, without particularly limited in the embodiments of the present disclosure.

For example, the driving circuit 610 is configured to provide a driving current to the light-emitting element 700 under the control of a driving signal such as a gate scanning signal, a data signal, and a voltage signal, so that the organic light-emitting layer included in the light-emitting element emits light. For example, the driving circuit 610 may adopt pixel circuits such as 4T1C, 4T2C, 7T1C, 8T2C or other circuit structures, and its driving method may adopt conventional methods in the art, without repeated here. For example, the pixel circuit structure may be fabricated on a silicon substrate using a CMOS process, without particularly limited in the embodiments of the present disclosure.

For example, as illustrated in FIG. 9, the silicon substrate 600 further includes a first insulation layer 620 and a second insulation layer 650 that are located between the driving circuit 610 and the light-emitting element 700; and a via hole 630 is provided in both the first insulation layer and the second insulation layer. For example, the via hole 630 may be filled with a metal of tungsten to form a tungsten via. In the case where the thicknesses of the first insulation layer 620 and the second insulation layer 650 are relatively large, forming a tungsten via in the first insulation layer 620 and the second insulation layer 650 can be beneficial to the stability of a conductive path; furthermore, because the process of forming a tungsten via is mature, the first insulation layer 620 and the second insulation layer 650 as obtained have good surface flatness, which is beneficial to reducing a contact resistance between the electrode included in the light-emitting element 700 and each of the first insulation layer 620 and the second insulation layer 650.

For example, as illustrated in FIG. 9, a metal layer 640 is provided between the via holes 630 in the two insulation layers to electrically connect the light-emitting element 700 with the driving circuit 610.

For example, as illustrated in FIG. 9, the first electrode 710 included in the light-emitting element 700 is electrically connected with the driving circuit 610 through the via holes 630 located in the insulation layers, and the driving circuit 610 is configured to drive the light-emitting element 700 to emit light. The light-emitting element 700 includes a plurality of light-emitting sub-elements, and the light-emitting function layers 720 of adjacent light-emitting sub-elements are separated by a pixel defining layer 800.

For example, the driving circuit 610 includes at least a driving transistor and a switching transistor (not illustrated in FIG. 9, please refer to FIG. 11), and the driving transistor and the first electrode 710 are electrically connected with each other. Thus, the electric signal for driving the light-emitting element 700 is transmitted to the first electrode 710, thereby controlling the light-emitting element 700 to emit light. For example, the driving transistor includes a gate electrode, a source electrode, and a drain electrode. The source electrode of the driving transistor is electrically connected with the first electrode 710. When the driving transistor is in an on state, the electric signal provided by a power line may be transmitted to the first electrode 710 through the source electrode of the driving transistor. Because a voltage difference is formed between the first electrode 710 and the second electrode 730, an electric field is formed between the two electrodes, and the light-emitting functional layer 720 emits light under the action of the electric field.

For example, as illustrated in FIG. 9, light-emitting sub-elements included in the light-emitting element 700 are in a one-to-one correspondence to the color filters of the sub-pixels. For example, the light emitted from the light-emitting element 700 is white light, and the white light passes through the pixel color filters of different colors located on a display side of the light-emitting element 700 to realize colored display.

For example, as illustrated in FIG. 9, the sensing region 103 located in the peripheral region 102 is also provided with a light-emitting element having the same structures as the light-emitting element 700 in the display region 101. The light-emitting element located in the sensing region 103 is not used for display, but used to detect the attenuation degree of the light emission of the pixel. Therefore, the light-emitting element located in the sensing region 103 needs to be shielded by the bezel color filter located in the peripheral region 102.

In some examples, as illustrated in FIG. 9, the transparent base layer 100 is a thin-film encapsulation layer, and the thin-film encapsulation layer is located at a side of the first color filter layer 200 facing the light-emitting element 700.

For example, the above-mentioned transparent base layer 100 is the first thin-film encapsulation layer 100; and a second thin-film encapsulation layer 100' is provided at a side of the color filter structure away from the light-emitting element 700; the first thin-film encapsulation layer 100 and the second thin-film encapsulation layer 100' can realize the effective encapsulation of the light-emitting element, realize the effective barrier to water vapor, oxygen, etc., and achieve the purpose of protecting the light-emitting element and prolonging the service life of the light-emitting element.

For example, a cover plate (not illustrated) is also provided at a side of the second thin-film encapsulation layer away from the color filter structure; and the second thin-film encapsulation layer and the cover plate are sequentially arranged on the color filter structure to protect the color filter structure. For example, the second thin-film encapsulation layer is made of one of or a combination of more of organic materials or inorganic materials with good sealing properties so as to achieve a good sealing effect and protect the silicon-based Organic Light-Emitting Diode (OLED) display device. For example, the cover plate can be made of a transparent material. For example, the transparent material can be an inorganic material such as glass or an organic material such as polyimide. For example, in the embodiments of the present disclosure, glass with high transmittance may be used, and the embodiment is not limited thereto.

Regarding the technical effects of the light-emitting diode display panel provided by the embodiments of the present disclosure, reference may be made to the technical effects of the color filter structure provided by the embodiments of the present disclosure, without repeated here.

Figure 10:
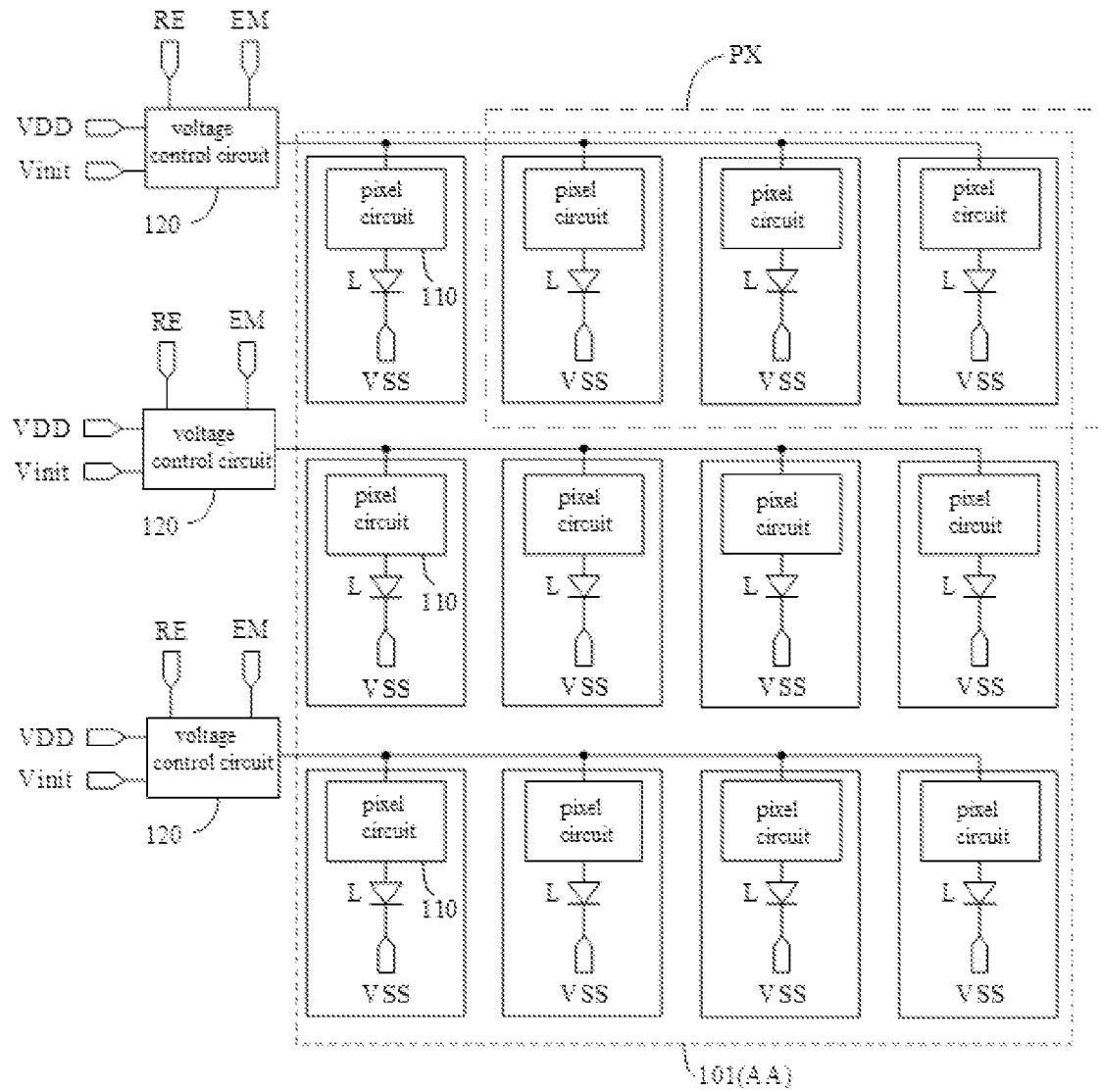
FIG. 10 is a schematic circuit principle diagram of a silicon-based organic light-emitting display panel provided by an embodiment of the present disclosure.

FIG. 10 is a schematic circuit principle diagram of a silicon-based organic light-emitting display panel provided by some embodiments of the present disclosure. The silicon-based organic light-emitting display panel includes a plurality of display components L (i.e., light-emitting elements) located in the display region 101 (region AA), and pixel circuits 110 coupled to the plurality of display components L in a one-to-one correspondence. The pixel circuits 110 (i.e., the driving circuit 610 in FIG. 9) includes a driving transistor. In addition, the silicon-based organic light-emitting display panel may further include a plurality of voltage control circuits 120 located in the peripheral region 102 (a region other than the display region 101 in the silicon-based organic light-emitting display panel) of the silicon-based organic light-emitting display panel. For example, at least two pixel circuits 110 in one row share one voltage control circuit 120; the first electrodes of the driving transistors in the pixel circuits 110 of the same row is coupled to the shared voltage control circuit 120; and the second electrode of each driving transistor is coupled to a corresponding display component L. The voltage control circuit 120 is configured to output an initialization signal Vinit to the first electrode of the driving transistor in response to a reset control signal RE so as to control the corresponding display component L to reset, and is configured to output a first power signal VDD to the first electrode of the driving transistor in response to a light emission control signal EM so as to drive the display component L to emit light. By sharing the voltage control circuit 120, the structure of each pixel circuit in the display region 101 can be simplified, and the occupied area of the pixel circuit in the display region 101 can be reduced, so that more pixel circuits and display components can be provided in the display region 101 to obtain an organic light-emitting display panel of high PPI. In addition, the voltage control circuit 120 outputs the initialization signal Vinit to the first electrode of the driving transistor under the control of the reset control signal RE to control the reset of the corresponding display component, so as to prevent the voltage applied to the display component in a previous frame from affecting light emission of a subsequent frame, thereby mitigating the afterimage phenomenon.

For example, the silicon-based organic light-emitting display panel may further include a plurality of pixel units PX located in the display region 101, each pixel unit PX includes a plurality of sub-pixels; each sub-pixel includes one display component L and one pixel circuit 110. Further, the pixel unit PX may include three sub-pixels of different colors. The three sub-pixels may be red sub-pixel, green sub-pixel, and blue sub-pixel. Of course, the pixel unit PX may also include 4, 5 or more sub-pixels, which needs to be designed and determined according to the actual application environment, without limited here.

For example, the pixel circuits 110 in at least two adjacent sub-pixels in the same row may share one voltage control circuit 120. For example, in some examples, as illustrated in FIG. 10, all the pixel circuits 110 in the same row may share one voltage control circuit 120. Also, in other examples, the pixel circuits 110 in two, three or more adjacent sub-pixels in the same row may share one voltage control circuit 120, without limited here. In this way, an area occupied by the pixel circuit in the display region 101 can be reduced by sharing the voltage control circuit 120.

Figure 11:
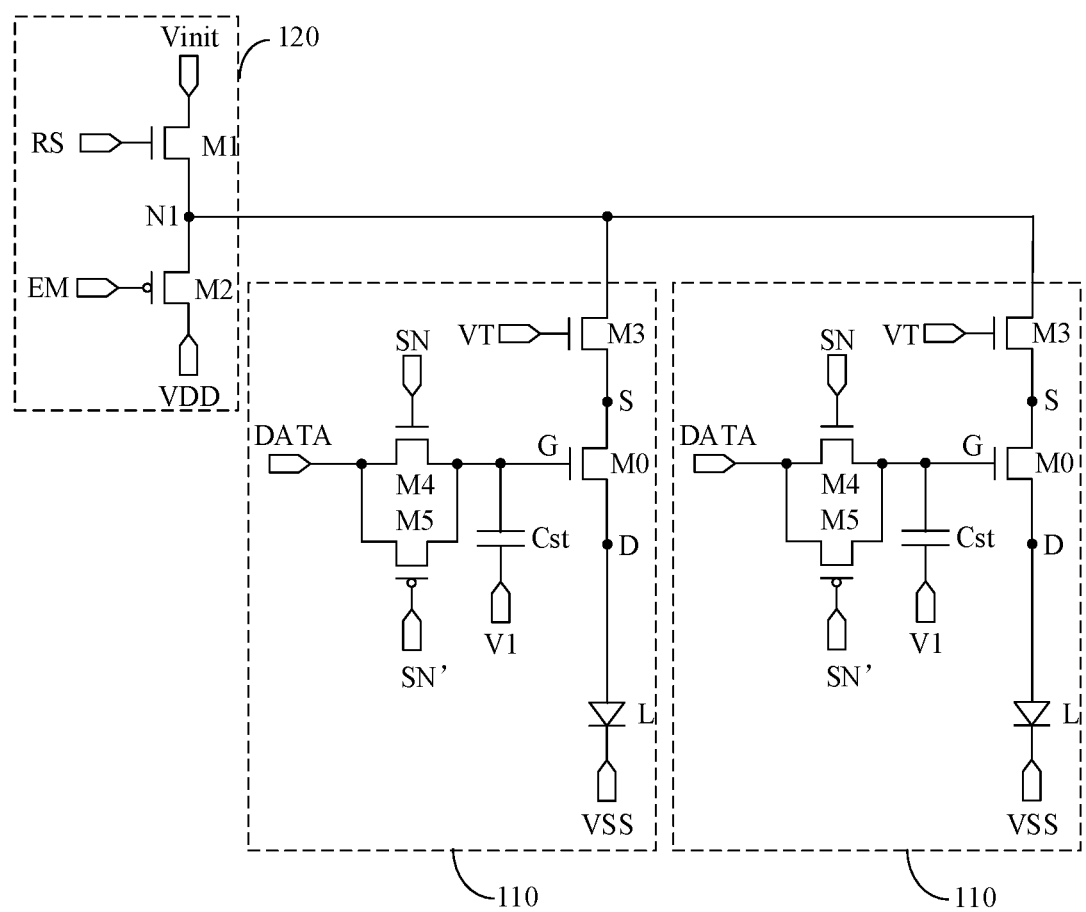
FIG. 11 is a circuit diagram of a voltage control circuit and a pixel circuit provided by an embodiment of the present disclosure.

FIG. 11 is a circuit diagram of a specific implementation of a voltage control circuit and a pixel circuit in a display panel provided by some embodiments of the present disclosure. For example, the driving transistor M0 in the pixel circuit 110 (i.e., the driving circuit 610 illustrated in FIG. 9) may be a transistor of N-type. Furthermore, the light-emitting element L may include an OLED. In this way, an anode of the OLED is electrically connected with the second electrode D of the driving transistor M0, and a cathode of the OLED is electrically connected with the second power terminal VSS. A voltage of the second power terminal VSS is generally a negative voltage or a grounding voltage VGND (generally 0V), and a voltage of the initialization signal Vinit may also be a grounding voltage VGND, without limited here. For example, the OLED may be Micro-OLED or Mini-OLED, which is further beneficial to obtaining an organic light-emitting display panel with high PPI.

For example, as illustrated in FIG. 11, the voltage control circuit 120 may include a first switching transistor M1 and a second switching transistor M2; in addition to the driving transistor M0, the pixel circuit 110 may also include a third switching transistor M3, a fourth switching transistor M4, a fifth switching transistor M5 and a storage capacitor Cst.

For example, as illustrated in FIG. 11, a gate electrode of the first switching transistor M1 is configured to receive a reset control signal RE, a first electrode of the first switching transistor M1 is configured to receive an initialization signal Vinit, and a second electrode of the first switching transistor M1 is coupled to a first electrode of the third switching transistor M3. A gate electrode of the second switching transistor M2 is configured to receive a light emission control signal EM, a first electrode of the second switching transistor M2 is configured to receive a first power signal VDD, and a second electrode of the second switching transistor M2 is coupled to the first electrode of the third switching transistor M3.

For example, the types of the first switching transistor M1 and the second switching transistor M2 may be different. For example, the first switching transistor M1 is a transistor of N-type, and the second switching transistor M2 is a transistor of P-type. Alternatively, the first switching transistor M1 is a transistor of P-type, and the second switching transistor M2 is a transistor of N-type. Of course, the types of the first switching transistor M1 and the second switching transistor M2 may also be the same. In actual applications, the types of the first switching transistor M1 and the second switching transistor M2 need to be designed according to the actual application environment, without limited here.

For example, as illustrated in FIG. 11, a gate electrode of the third switching transistor M3 is configured to receive a transmission control signal VT; the first electrode of the third switching transistor M3 is coupled to the second electrode of the first switching transistor M1 and coupled to the second electrode of the second switching transistor M2, and is configured to receive the initialization signal Vinit transmitted from the first switching transistor M1 or the first power signal VDD transmitted from the second switching transistor M2; the second electrode of the third switching transistor M3 is coupled to the first electrode S of the driving transistor M0. For example, the third switching transistor M3 can be controlled to be turned on or off by controlling whether the transmission control signal VT is input, so as to control a light-emitting time of the light-emitting element L, thereby realizing pulse width modulation (PWM) dimming. The control method is beneficial for the uniformity of the PWM control of each sub-pixel.

For example, the pixel circuit 110 may further include a fourth switching transistor M4 and a storage capacitor Cst. For example, a gate electrode of the fourth switching transistor M4 is configured to receive a gate scanning signal SN, a first electrode of the fourth switching transistor M4 is configured to receive a data signal DATA, and a second electrode of the fourth switching transistor M4 is coupled to the gate electrode G of the driving transistor M0. A first terminal of the storage capacitor Cst is coupled to the gate electrode G of the driving transistor M0, and a second terminal of the storage capacitor Cst is coupled to the first voltage terminal V1. A voltage of the first voltage terminal V1 may be a grounding voltage VGND, and the embodiments of the present disclosure include but are not limited thereto. For example, the storage capacitor is configured to store the data signal DATA as written in, so that the driving transistor M0 drives the light-emitting element L to emit light based on the stored data signal DATA.

For example, the pixel circuit 110 may further include a fifth switching transistor M5. For example, a gate electrode of the fifth switching transistor M5 is configured to receive an inverted signal SN' of the gate scanning signal SN, a first electrode of the fifth switching transistor M5 is configured to receive the data signal DATA, and a second electrode of the fifth switching transistor M5 is coupled to the gate electrode G of the driving transistor M0. In addition, the fifth switching transistor M5 and the fourth switching transistor M4 have different types. For example, in some examples, as illustrated in FIG. 11, the fourth switching transistor M4 is a transistor of N-type, and the fifth switching transistor M5 is a transistor of P-type; alternatively, in other examples, the fourth switching transistor M4 is a transistor of P-type, and the fifth switching transistor M5 is a transistor of N-type.

It should be explained that the pixel circuit structure illustrated in FIG. 11 is only exemplary, and any other pixel circuit structure may also be adopted according to the embodiments of the present disclosure.

The driving transistor M0, the first switching transistor M1, the second switching transistor M2, the third switching transistor M3, the fourth switching transistor M4, and the fifth switching transistor M5 are MOS transistors prepared on a base substrate 600 (for example, a silicon-based substrate). For example, at least a part of these transistors are located in the base substrate. For example, at least a source electrode region and a drain electrode region of these transistors are located in the base substrate 600.

Another embodiment of the present disclosure provides a light-emitting diode display device including the above-described light-emitting diode display panel. The light-emitting diode display device provided by the embodiment of the present disclosure is a small-sized light-emitting diode display device, that is, a micro light-emitting diode display device. The light-emitting diode display device can be applied to any products or components with display functions such as televisions, digital cameras, mobile phones, watches, tablet computers, notebook computers, navigators, etc., and is particularly suitable for use in helmet-mounted displays, stereoscopic display mirrors, eyeglass-type displays, etc. The above-mentioned micro light-emitting diode display device can be communicated with mobile communication networks, satellite positioning and other systems to obtain accurate image information at any place and at any time.

The present embodiments are not limited thereto, and the light-emitting diode display device provided by the embodiment of the present disclosure may also be applied to a virtual reality device or an augmented reality device.

Regarding the technical effects of the light-emitting diode display device provided by the embodiments of the present disclosure, reference may be made to the technical effects of the color filter structure provided by the embodiments of the present disclosure, without repeated here.

Figure 12:
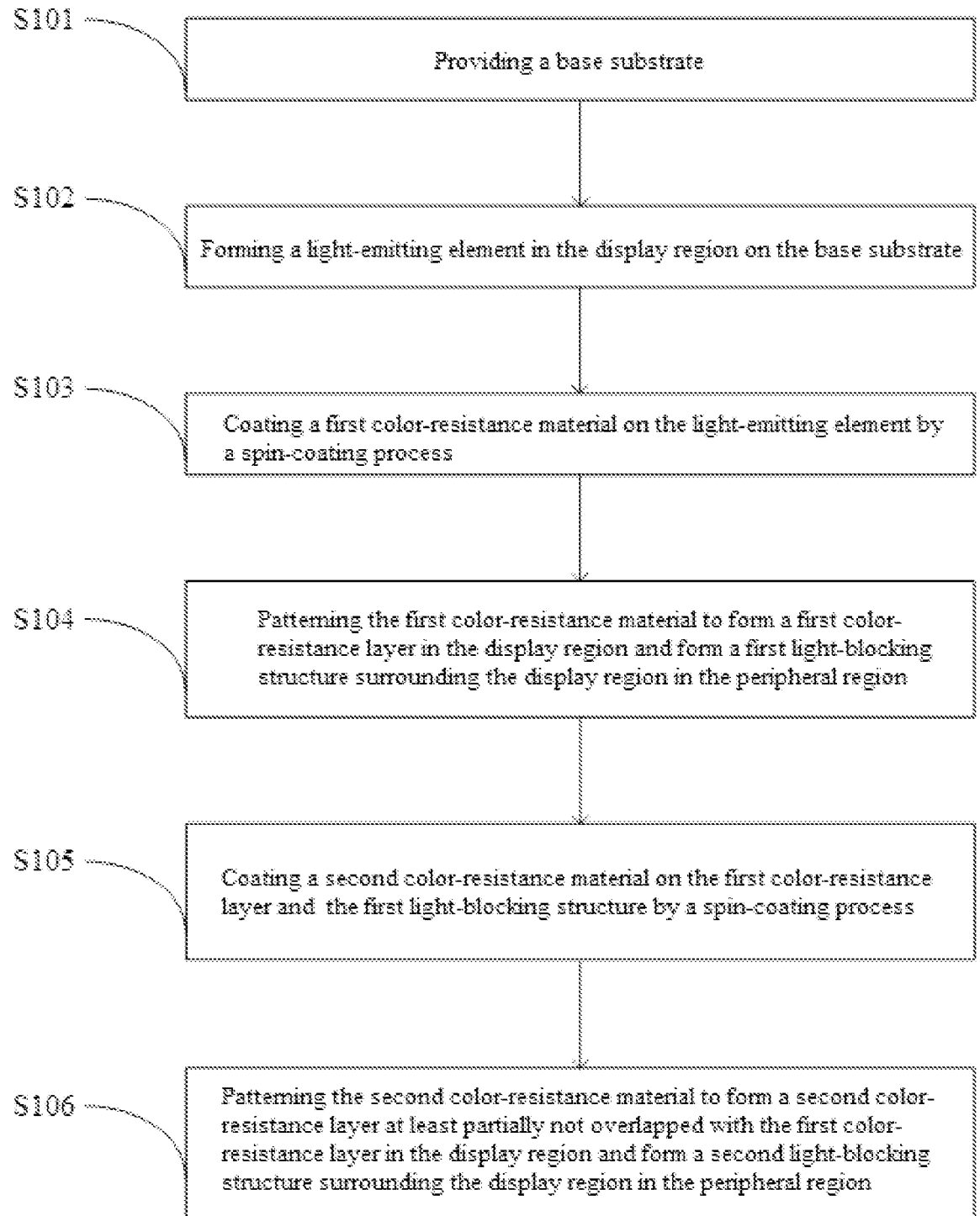
FIG. 12 is a flowchart of a manufacturing method of a light-emitting diode display panel provided by an embodiment of the present disclosure.

Another embodiment of the present disclosure provides a manufacturing method of a light-emitting diode display panel. FIG. 12 is a flowchart of a manufacturing method of a light-emitting diode display panel provided by an embodiment of the present disclosure. Referring to FIG. 2A-FIG. 7B and FIG. 9-FIG. 12, the manufacturing method includes the following steps.

S101: Providing a base substrate.

For example, as illustrated in FIG. 9, the base substrate 600 may be a silicon substrate.

For example, as illustrated in FIG. 9, the base substrate 600 includes a display region 101 and a peripheral region 102 surrounding the display region 101. A driving circuit 610, a gate driver circuit, and a data driver circuit (not illustrated in the figure) are integrated on the silicon substrate 600. The peripheral region 102 of the silicon substrate 600 may be provided with a flexible circuit board configured to transmit electric signals to the gate driver circuit, the data driver circuit, and the like.

For example, the driving circuit 610 may adopt pixel circuits of 4T1C, 4T2C, 7T1C, 8T2C, or other circuit structures, and its driving method may adopt conventional methods in the art, without repeated here. For example, the pixel circuit structure can be fabricated on a silicon substrate by using a CMOS process, and the embodiments of the present disclosure are not limited thereto.

S102: Forming a light-emitting element in the display region on the base substrate.

For example, as illustrated in FIG. 9, forming the light-emitting element 700 includes forming a first electrode 710, a light-emitting functional layer 720, and a second electrode 730 that are stacked in sequence. The first electrode 710 is electrically connected with the driving circuit 610, and the driving circuit 610 is configured to drive the light-emitting element 700 to emit light.

S103: Coating a first color-resistance material on the light-emitting element by using a spin-coating process.

For example, in an actual process, the silicon substrate includes a plurality of light-emitting diode display panel regions for forming a plurality of light-emitting diode display panels, and after forming a light-emitting element in each light-emitting diode display panel region, a spin-coating process is used to coat the first color filter material layer (that is, the first color-resistance material) to cover each light-emitting diode display panel region. Of course, the embodiments of the present disclosure are not limited to the spin-coating process, and other methods may also be used to coat the first color-resistance material.

For example, the spin-coating process refers to a coating process that relies on the centrifugal force and the action of gravity generated by rotating a workpiece to spread droplets of coating material onto a surface of the workpiece. Using the spin-coating process to coat the first color filter material layer includes: dripping the first color filter material at a position outside the light-emitting diode display panel region of the silicon substrate, and rotating the silicon substrate so that the first color filter material is uniformly distributed on the light-emitting elements in the light-emitting diode display panel region so as to form the first color filter material layer with uniform thickness.

For example, a coating speed may be different depending on the color of the first color filter material.

For example, before forming the first color filter material layer, the manufacturing method further includes forming a transparent base layer on the light-emitting element, that is, a thin-film encapsulation layer covering the light-emitting element.

S104: Patterning the first color-resistance material to form a first color-resistance layer in the display region, and to form a first light-blocking structure surrounding the display region in the peripheral region.

For example, as illustrated in FIG. 2A, after the first color filter material layer is subjected to processes such as pre-baking, exposing, developing and post-baking, the first pixel color filter 210 (i.e., the first color-resistance layer) can be formed in the display region 101, and a first bezel color filter 220 (i.e., a first light-blocking structure) can be formed in the peripheral region 102. The formed first bezel color filter 220 has a non-enclosed annular shape, that is, it includes at least one first interval.

In the embodiment of the present disclosure, the shape of the first bezel color filter is designed to be a non-enclosed shape, so that during the subsequent process of forming other color filter layers, the color filter material dripped at an outer side of the first bezel color filter can pass through the first interval of the first bezel color filter to be coated in the display region in a spin-coating process; in this way, the degree of uniformity of the color filter layer coated in the display region is higher, and the phenomenon of nonuniform display occurred in the display device including the color filter structure is avoided.

In some examples, as illustrated in FIG. 2A and FIG. 2B, forming the first bezel color filter 220 includes: patterning the first color filter material layer to form a plurality of first intervals 201 configured to communicate the display region 101 with a region outside the peripheral region 102.

For example, the first pixel color filter and the first bezel color filter formed by the present embodiment of the present disclosure have the same characteristics and effects as the first pixel color filter and the first bezel color filter illustrated in FIG. 2A and FIG. 2B, respectively, without repeated here.

S105: Coating, by using a spin-coating process, a second color-resistance material on the first color-resistance layer and on the first light-blocking structure.

For example, as illustrated in FIG. 3A and FIG. 3B, after forming the first pixel color filter and the first bezel color filter, the manufacturing method further includes: applying, by using a spin-coating process, a second color filter material layer (that is, a second color-resistance material) on the first pixel color filter 210 and on the first bezel color filter 220. Of course, the embodiments of the present disclosure are not limited to the spin-coating process, and other methods may also be used to apply the second color-resistance material.

For example, dripping the second color filter material in a region outside the first bezel color filter 220, and then rotating the silicon substrate 600 to uniformly coat the second color filter material in the display region 101 and in the peripheral region 102 of each light-emitting diode display panel region so as to form a second color filter material layer. Because the first bezel color filter is formed with a plurality of first intervals, in a subsequent process of forming the second color filter layer, the second color filter material that flows through the first interval and enters into the display region of a certain color filter structure region can flow out of the display region through another first interval and then flow into a display region of another color filter structure region adjacent to the certain color filter structure region, so that the second color filter layer in the display region of the plurality of color filter structure regions has a higher degree of uniformity.

S106: Patterning the second color-resistance material to form a second color-resistance layer that is at least partially not overlapped with the first color-resistance layer and is located in the display region, and to form a second light-blocking structure that surrounds the display region and is located in the peripheral region.

For example, as illustrated in FIG. 3A and FIG. 3B, after the second color filter material layer is coated, the second color filter material layer is patterned by, for example, an exposure-and-development process, to form the second pixel color filter 310 (i.e., second color-resistance layer) that is located in the display region 101 and is at least partially not overlapped with the first pixel 210, and to form the annular-shaped second bezel color filter 320 (i.e., second light-blocking structure) on the first bezel color filter 220; the second bezel color filter 320 is located around the display region 101, and the second bezel color filter 320 at least fully fills the plurality of first intervals 201.

For example, applying, by using a spin-coating process, the second color-resistance material on the first color-resistance layer and on the first light-blocking structure includes: providing the second color-resistance material in a region outside the first light-blocking structure; and rotating the base substrate so that the second color-resistance material is uniformly coated in the display region and in the peripheral region, and at least a part of the second color-resistance material flows to an inner side of the first light-blocking structure through the first interval.

For example, the second bezel color filter formed by the above method may have the structure in any of the examples in FIG. 3A to FIG. 4B. In the manufacturing method provided by the embodiment of the present disclosure, by forming a second interval in the second bezel color filter, in a subsequent process of forming other color filter layers, the color filter material that flows through the second interval and enters into the display region of a certain light-emitting diode display panel region can flow out of the display region through another second interval and then flow into a display region of another light-emitting diode display panel region adjacent to the certain light-emitting diode display panel region, so that the color filter layer in the display region of the plurality of light-emitting diode display panel regions has higher degree of uniformity, and the phenomenon of nonuniform display occurred in the display devices including the plurality of color filter structures can be avoided.

For example, as illustrated in FIG. 5A and FIG. 5B, the formed second bezel color filter 320 may also only fully fill the first interval 201 of the first bezel color filter 220, that is, a pattern of the second bezel color filter 320 is complementary to a pattern of the first bezel color filter 220. Because the first bezel color filter and the second bezel color filter only constitute one layer of bezel color filter, a thickness of the bezel color filter can be reduced, so that in a subsequent process of forming other color filter layers, a color filter material dripped at an outer side of the first bezel color filter can be uniformly coated in the display region during a spin-coating process; in this way, the degree of uniformity of the color filter layer coated in the display region is higher.

In some examples, as illustrated in FIG. 6A and FIG. 6B, after forming the second pixel color filter and the second bezel color filter, the manufacturing method further includes: applying, by using a spin-coating process, a third color filter material layer on the second pixel color filter 310 and on the second bezel color filter 320.

For example, dripping a third color filter material in a region outside the second bezel color filter 320, and then rotating the silicon substrate 600 to uniformly coat the third color filter material in the display region 101 and in the peripheral region 102 of each light-emitting diode display panel region to form a third color filter material layer. Because the formed second bezel color filter includes a plurality of second intervals, during the subsequent process of forming the third color filter layer, the third color filter material that flows through the second interval and enters into the display region of a certain color filter structure region can flow out of the display region through another second interval and then flow into a display region of another color filter structure region adjacent to the certain color filter structure region, so that the third color filter layer in the display region of the color filter structure regions has a higher degree of uniformity.

For example, as illustrated in FIG. 6A and FIG. 6B, after coating the third color filter material layer, patterning the third color filter material layer, by using a process such as exposure and development, to form a third pixel color filter 410 that is located in the display region 101 and is at least partially not overlapped with the first pixel color filter 210 and not overlapped with the second pixel color filter 310, and to form a third bezel color filter 420 surrounding the display region 101 on the second bezel color filter 320, and the third bezel color filter 420 at least fully fills the plurality of second intervals 301. The third pixel color filter and the third bezel color filter formed by the present embodiment of the present disclosure have the same characteristics and effects as the third pixel color filter and the third bezel color filter illustrated in FIG. 6A and FIG. 6B, respectively, without repeated here.

For example, as illustrated in FIG. 7A and FIG. 7B, after forming the second pixel color filter and the second bezel color filter, the manufacturing method further includes:

applying, by using a spin-coating process, a third color filter material layer on the second pixel color filter 310 and on the second bezel color filter 320.

For example, dripping a third color filter material in a region outside the second bezel color filter 320, and then rotating the silicon substrate 600 to uniformly coat the third color filter material in the display region 101 and in the peripheral region 102 of each light-emitting diode display panel region to form a third color filter material layer. Because the first bezel color filter and the second bezel color filter only constitute one layer of bezel color filter, a thickness of the bezel color filter can be reduced, so that in a subsequent process of forming the third color filter layer, the third color filter material dripped at an outer side of the first bezel color filter can be uniformly coated in the display region during a spin-coating process; in this way, the degree of uniformity of the third color filter layer coated in the display region is higher.

For example, as illustrated in FIG. 7A and FIG. 7B, after coating the third color filter material layer, patterning the third color filter material layer by a process such as exposure and development, to form a third pixel color filter 410 that is located in the display region 101, is at least partially not overlapped with the first pixel color filter 210 and is at least partially not overlapped with the second pixel color filter 310, and to form a third bezel color filter 420 surrounding the display region 101 on the second bezel color filter 320; an orthographic projection of the third bezel color filter 420 on the transparent base layer 100 is in an enclosed annular shape (closed ring), that is, the third bezel color filter 420 is a continuous film layer and completely covers the first bezel color filter 220 and the second bezel color filter 320, so as to cooperate with the first bezel color filter and the second bezel color filter 320 to play a role of light-shielding and anti-reflection.

Another example of the embodiment of the present disclosure provides a manufacturing method of a light-emitting diode display panel. Referring to FIG. 8A-FIG. 8B, the manufacturing method of the present example is different from the manufacturing method provided by the previous example in that, before forming the first color filter material layer, the manufacturing method of the present example includes: coating a fourth color filter material layer on the light-emitting element by a spin-coating process, and patterning the fourth color filter material layer to form a fourth pixel color filter 510 only in the display region 101. The fourth color filter material layer in this example can have the same color as the third color filter material layer in the previous example, but the fourth color filter material layer in this example is formed before the first color filter layer is formed, and the peripheral region only includes two color filter layers that are the first bezel color filter and the second bezel color filter. Of course, the embodiments of the present disclosure are not limited thereto, and the fourth color filter material layer may also be a color filter material layer of a different color from the third color filter material layer in the previous example.

For example, before forming the first color filter material layer, dripping a fourth color filter material at a position outside the light-emitting diode display panel region of the silicon substrate, and rotating the silicon substrate to allow the fourth color filter material to be uniformly distributed in the plurality of light-emitting diode display regions to form a fourth color filter material layer with uniform thickness, then pre-baking, exposing, developing and post-baking the fourth color filter material layer to form the fourth pixel color filter only in the display region.

For example, after forming the fourth pixel color filter, coating, by using a spin-coating process, a first color filter material layer on the fourth pixel color filter, that is, dripping a first color filter material on the silicon substrate at a region outside the light-emitting diode display panel region, and rotating the silicon substrate to allow the first color filter material to be uniformly distributed in the peripheral region and in the display region (including the fourth pixel color filter) of the plurality of light-emitting diode display panel regions to form a first color filter material layer with uniform thickness. Then, patterning the first color filter material layer to form a first pixel color filter that is at least partially not overlapped with the fourth pixel color filter in the display region, and to form a first bezel color filter surrounding the display region in the peripheral region. The first pixel color filter and the first bezel color filter formed in this example have the same characteristics and effects as the first pixel color filter and the first bezel color filter formed by the manufacturing method provided by the previous example, respectively, without repeated here.

For example, in the manufacturing method provided by this example, after the first pixel color filter and the first bezel color filter are formed, the characteristics and effects of the formed second pixel color filter and its positional relationship with respect to the first bezel color filter are the same as the characteristics and effects of the second bezel color filter illustrated in FIG. 4A and FIG. 4B and its positional relationship with respect to the first bezel color filter, respectively, without repeated here.

For example, after the color filter structure is formed, the manufacturing method provided by the embodiment of the present disclosure further includes forming a thin-film encapsulation layer at a side of the color filter structure away from the light-emitting element. Two thin-film encapsulation layers located at both sides of the color filter structure can realize effective encapsulation of the light-emitting elements, realize effective barrier to water vapor, oxygen, etc., to protect the light-emitting element and prolong the service life of the light-emitting elements.

For example, both of the two thin-film encapsulation layers can be made of one of or a combination of more of organic materials or inorganic materials with good sealing properties to achieve a good sealing effect and protect the light-emitting elements of the silicon-based organic light-emitting diode.

For example, after forming a thin-film encapsulation layer at the side of the color filter structure away from the light-emitting element, the manufacturing method further includes forming a cover plate at a side of the thin-film encapsulation layer away from the color filter structure to realize the function of protecting the color filter structure.

For example, the cover plate can be made of a transparent material. For example, the transparent material may be an inorganic material such as glass or an organic material such as polyimide. For example, in the embodiments of the present disclosure, plain glass with high transmittance may be used, and the embodiment of the present disclosure is not limit thereto.

The technical effects of the light-emitting diode display panel manufactured by the manufacturing method provided by the embodiments of the present disclosure may be referred to the technical effects of the color filter structure provided by the embodiments of the present disclosure, without repeated here.

The following statements need to be explained:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure can be combined.

The above are merely particular embodiments of the present disclosure but are not limitative to the scope of the present disclosure. The scope(s) of the present disclosure should be defined in the appended claims.

What is claimed is:

1. A display panel, comprising:
a base substrate;
a first color filter layer located on the base substrate; and
a second color filter layer located on the base substrate,
wherein the second color filter layer comprises a first sub-color-filter portion and a second sub-color-filter portion, the first color filter layer comprises a third sub-color-filter portion extending along a first direction, and the third sub-color-filter portion comprises a plurality of interval regions; the first sub-color-filter portion covers the third sub-color-filter portion except the plurality of interval regions, and the second sub-color-filter portion fills in the plurality of interval regions.

2. The display panel according to claim 1, wherein the first color filter layer comprises a green color filter layer, and the second color filter layer comprises a red color filter layer.

3. The display panel according to claim 1, wherein the sub-color-filter portion located between adjacent two second sub-color-filter portions that are arranged along an extending direction of the third sub-color-filter portion is a continuous structure.

4. The display panel according to claim 1, comprising a display region and a peripheral region surrounding the display region, wherein
the first color filter layer comprises a first bezel color filter located in the peripheral region, and the second color filter layer comprises a second bezel color filter located in the peripheral region.

5. The display panel according to claim 4, further comprising:
a plurality of sub-pixels located in the display region, wherein
the display panel comprises a plurality of sub-color-resistance layers arranged in a one-to-one correspondence with the plurality of sub-pixels, the plurality of sub-color-resistance layers comprise a plurality of first sub-color-resistance layers, and the plurality of first sub-color-resistance layers are a part of the first color filter layer; and
along an extending direction of the third sub-color-filter portion, a size of a portion of at least one interval region that is filled by the second sub-color-filter portion is not smaller than a size of at least one first sub-color-resistance layer.

6. The display panel according to claim 5, wherein a size of the at least one first sub-color-resistance layer along the first direction is smaller than 10 microns.

7. The display panel according to claim 1, wherein along a direction perpendicular to the base substrate, a thickness of the first sub-color-filter portion is equal to a thickness of the second sub-color-filter portion.

8. The display panel according to claim 1, further comprising:
a third color filter layer located at a side of the first color filter layer away from the base substrate, wherein
the third color filter layer comprises a portion which covers at least one of the first color filter layer, the second color filter layer and the interval region.

9. The display panel according to claim 8, wherein the third color filter layer covers the first color filter layer, the second color filter layer and the interval region.

10. The display panel according to claim 5, wherein the plurality of sub-color-resistance layers comprise a plurality of second sub-color-resistance layers, the plurality of second sub-color-resistance layers are a part of the second color filter layer, and at least part of the second sub-color-resistance layer is not overlapped with the first sub-color-resistance layer.

11. The display panel according to claim 1, wherein a surface of the second sub-color-filter portion away from the base substrate is flush with a surface of the third sub-color-filter portion away from the base substrate.

12. The display panel according to claim 8, wherein the third color filter layer comprises a blue color filter layer.

13. A display device, comprising the display panel according to claim 1.

* * * * *